(12) United States Patent
Ye et al.

(10) Patent No.: US 10,571,543 B2
(45) Date of Patent: Feb. 25, 2020

(54) METHODS AND APPARATUSES FOR PHASE UNWRAPPING

(71) Applicant: SHANGHAI UNITED IMAGING HEALTHCARE CO., LTD., Shanghai (CN)

(72) Inventors: Yongquan Ye, Houston, TX (US); Jinguang Zong, Shanghai (CN)

(73) Assignee: SHANGHAI UNITED IMAGING HEALTHCARE CO., LTD, Shanghai (CN)

( * ) Notice: Subject to any disclaimer, the term of this patent is extended or adjusted under 35 U.S.C. 154(b) by 156 days.

(21) Appl. No.: 15/666,674

(22) Filed: Aug. 2, 2017

(65) Prior Publication Data
US 2018/0203087 A1    Jul. 19, 2018

Related U.S. Application Data

(63) Continuation of application No. 62/447,878, filed on Jan. 18, 2017.

(51) Int. Cl.
*G01R 33/565* (2006.01)
*G01R 33/44* (2006.01)
*G01R 33/561* (2006.01)

(52) U.S. Cl.
CPC ..... *G01R 33/56545* (2013.01); *G01R 33/443* (2013.01); *G01R 33/5615* (2013.01)

(58) Field of Classification Search
CPC ............ G01R 33/56545; G01R 33/443; G01R 33/5615; G01R 33/5616
See application file for complete search history.

(56) References Cited

U.S. PATENT DOCUMENTS

| | | | | |
|---|---|---|---|---|
| 4,720,679 A | * | 1/1988 | Patrick | G01R 33/24 324/309 |
| 2009/0256567 A1 | * | 10/2009 | Aksit | G01R 33/243 324/312 |

OTHER PUBLICATIONS

Robinson et al., A Method for Unwrapping Highly Wrapped Multi-echo Phase Images at Very High Field: UMPIRE, Magn Reson Med., 72(1): 80-92, 2014 (Year: 2014).*

(Continued)

*Primary Examiner* — Daniel R Miller
(74) *Attorney, Agent, or Firm* — Metis IP LLC

(57) ABSTRACT

The present disclosure relates to systems and methods for vehicle management. The systems may perform the methods to obtain a plurality of echo signals representing a subject, the plurality of echo signals being formed at a plurality of different echo times; generate a plurality of phase wrapped images based on the plurality of echo signals, each phase wrapped image comprising one or more first wrapped values; generate a phase difference map based on the plurality of phase wrapped images, the phase difference map comprising one or more second wrapped values; generate an unwrapped phase difference map by unwrapping the one or more second wrapped values in the phase difference map; determine a first field distribution map based on the unwrapped phase difference map; and generate a plurality of unwrapped phase images by unwrapping the one or more first wrapped values in each phase wrapped image based on the first field distribution map.

18 Claims, 15 Drawing Sheets

(56) References Cited

OTHER PUBLICATIONS

Abdul-Rahman et al., Fast and Robust Three-dimensional Best Path Phase Unwrapping Algorithm, Applied Optics, 46(26): 6623-6635, 2007.
Abdul-Rahman et al., Robust Three-dimensional Best-path Phase-unwrapping Algorithm That Avoids Singularity Loops, Applied Optics, 48(23): 4582-4596, 2009.
Wei Li et al., Integrated Laplacian-based Phase Unwrapping and Background Phase Removal for Quantitative Susceptibility Mapping. NMR Biomed, 27(2): 219-227, 2014.
Hassan Bagher-Ebadian et al., A modified Fourier-Based Phase Unwrapping Algorithm With an Application to MRI Venography, Journal of Magnetic Resonance Imagine, 27(3): 649-652, 2008.
Lin Li, The General Application of the Spherical Mean Value Method for Image Noise Reduction, Conf. Proc IEEE Eng. Med. Biol. Soc., 185-186, 2002.
E. Mark Haacke et al., Susceptibility Weighted Imaging (SWI), Magnetic Resonance in Medicine, 52: 612-618, 2004.
Chunlei Liu et al., Quantitative Susceptibility Mapping: Contrast Mechanisms and Clinical Applications, Tomography, 1(1): 3-17, 2015.
E. Mark Haacke et al., Quantitative Susceptibility Mapping: Current Status and Future Directions, Magn Reson Imaging, 33(1): 1-25, 2015.
Yi Wang et al., Quantitative Susceptibility Mapping (QSM): Decoding MRI Data for a Tissue Magnetic Biomarker, Magnetic Resonance in Medicine 73: 82-101, 2015.
Simon Robinson et al., A Method for Unwrapping Highly Wrapped Multi-echo Phase Images at Very High Field: UMPIRE, Magnetic Resonance in Medicine, 72(1): 80-92, 2014.
Yongquan Ye et al., Robust and Fast Phase Unwrapping Strategy to Improve SWI Quality, Int. Soc. Magn. Res. Med. Sci. Meet., 2017.

* cited by examiner

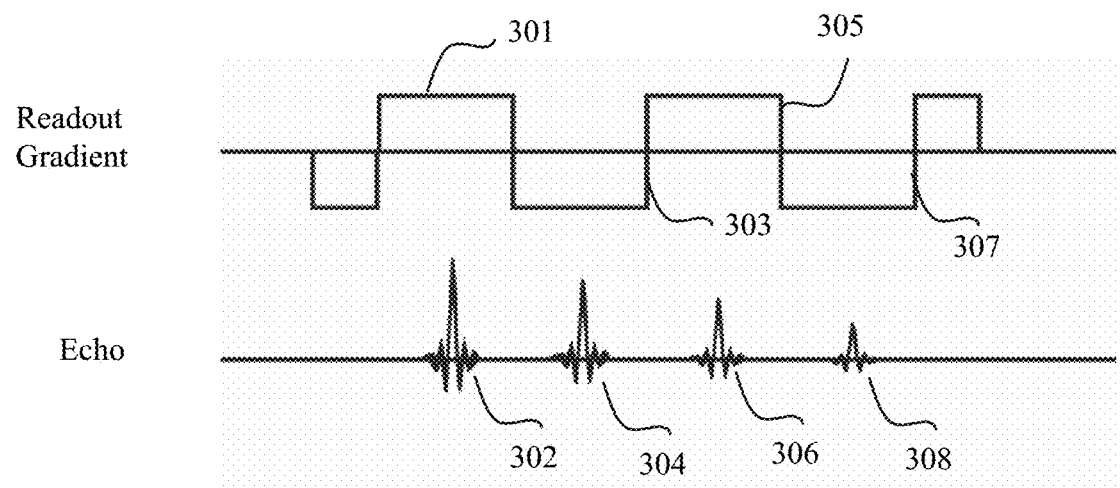
FIG. 3-A
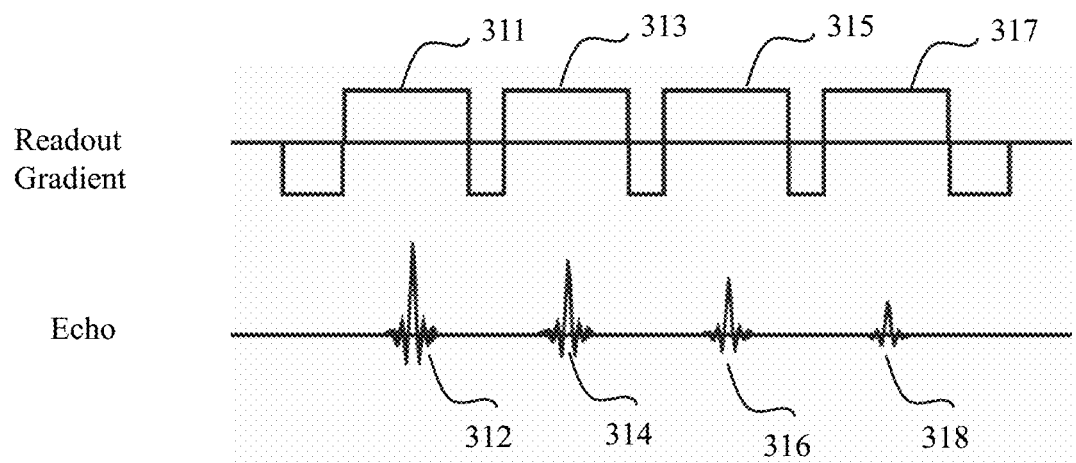
FIG. 3-B

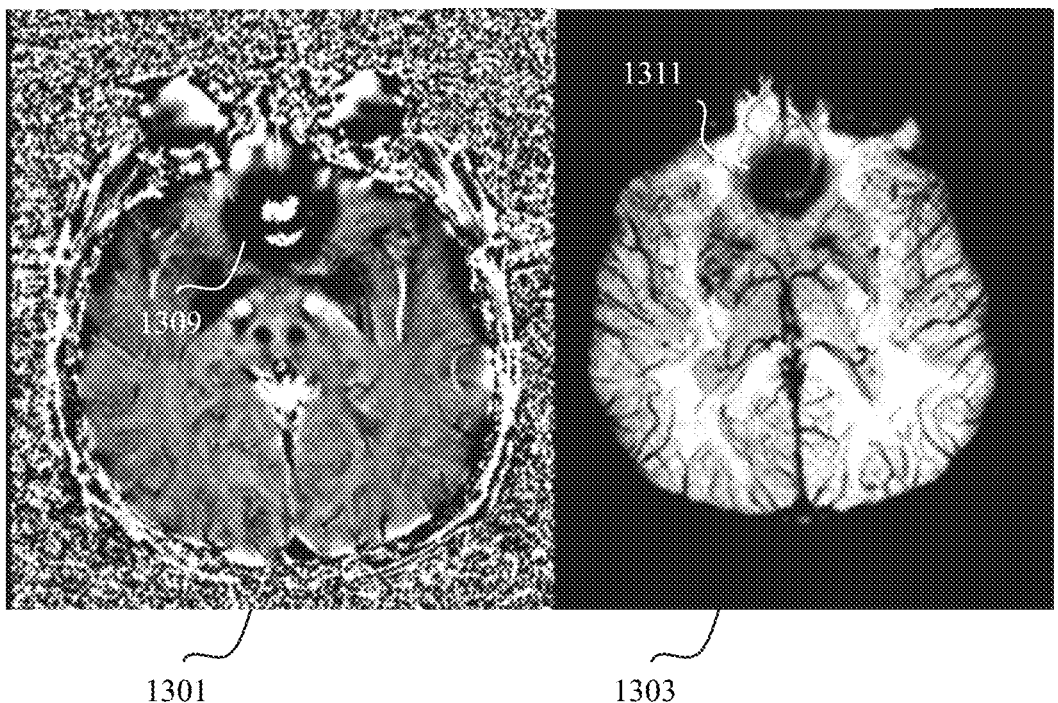
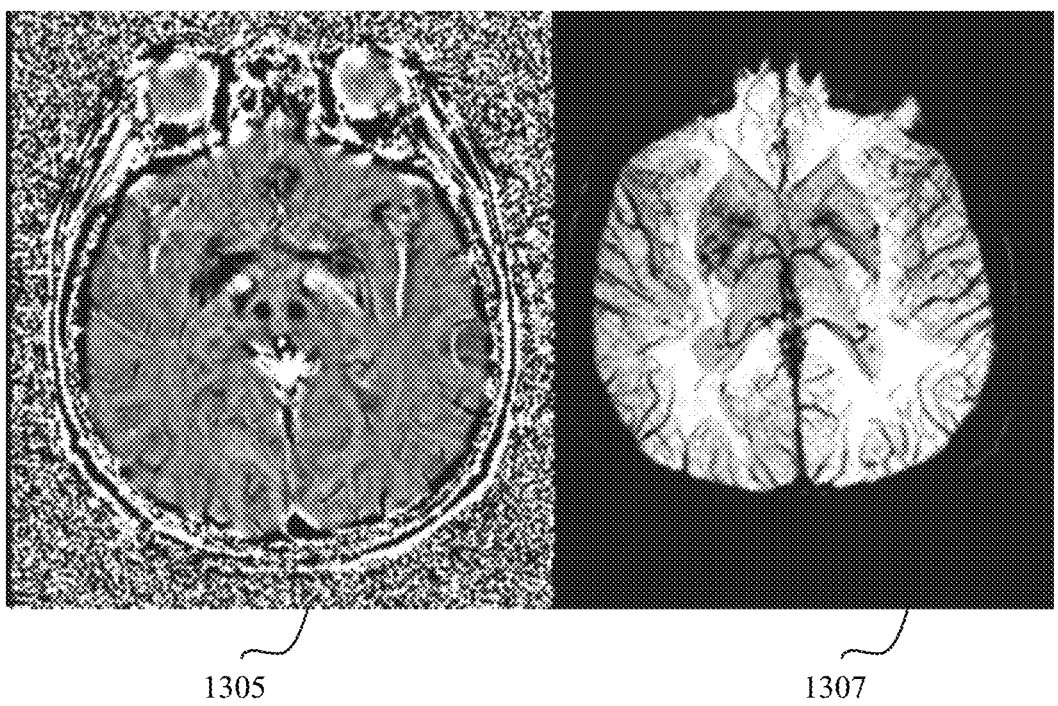
FIG. 13

METHODS AND APPARATUSES FOR PHASE UNWRAPPING

CROSS-REFERENCE TO RELATED APPLICATIONS

This application claims the benefit of U.S. Provisional Application No. 62/447,878, filed on Jan. 18, 2017, the content of which is hereby incorporated by reference in its entirety.

TECHNICAL FIELD

This disclosure generally relates to magnetic resonance imaging, and more particularly, to methods and apparatuses for phase unwrapping to improve the quality of an image.

BACKGROUND

For a complex signal such as an echo signal, the phase of the complex signal may be extracted using an inverse trigonometric function, which may make the phase be wrapped into a range of $2\pi$ and make an image generated based on the phase having artifacts. In order to improve the quality of the image, phase unwrapping may be performed. Phase unwrapping may refer to the process of determining the actual phase of a complex signal. However, there are some problems such as inaccuracy or lack of robustness in existing methods and apparatuses for phase unwrapping. Therefore, it is desirable to provide methods and apparatuses for accurate phase unwrapping.

SUMMARY

Additional features will be set forth in part in the description which follows, and in part will become apparent to those skilled in the art upon examination of the following and the accompanying drawings or may be learned by production or operation of the examples. The features of the present disclosure may be realized and attained by practice or use of various aspects of the methodologies, instrumentalities and combinations set forth in the detailed examples discussed below.

According to a first aspect of the present disclosure, a method for phase unwrapping for use in magnetic resonance imaging may include one or more of the following operations. One or more processors may obtain a plurality of echo signals representing a subject, the plurality of echo signals being formed at a plurality of different echo times. The one or more processors may generate a plurality of phase wrapped images based on the plurality of echo signals, each phase wrapped image comprising one or more first wrapped values. The one or more processors may generate a phase difference map based on the plurality of phase wrapped images, the phase difference map comprising one or more second wrapped values. The one or more processors may generate an unwrapped phase difference map by unwrapping the one or more second wrapped values in the phase difference map. The one or more processors may determine a first field distribution map based on the unwrapped phase difference map. The one or more processors may generate a plurality of unwrapped phase images by unwrapping the one or more first wrapped values in each phase wrapped image based on the first field distribution map.

In some embodiments, the phase difference map may comprise a plurality of phase difference values corresponding to at least two of the plurality of echo signals.

In some embodiments, the generating of the plurality of unwrapped phase images may comprise: selecting one of the plurality of phase wrapped images as a reference phase map; determining a relative phase shift of each phase wrapped image based on the reference phase map and the first field distribution map; generating a partially unwrapped phase map of each phase wrapped image based on the relative phase shift of each phase wrapped image and the reference phase map; generating a baseline phase map based on the reference phase map and the partially unwrapped phase map of each phase wrapped image; and generating the plurality of unwrapped phase images based on the baseline phase map, the reference phase map and the partially unwrapped phase map of each phase wrapped image.

In some embodiments, the one or more processors may generate a second field distribution map based on the reference phase map and the partially unwrapped phase map of each phase wrapped image.

In some embodiments, the generating of the unwrapped phase difference map may comprise: generating an intermediate phase difference map based on the phase difference map; generating a local quality map based on the intermediate phase difference map, the local quality map including a plurality of quality values, and each pixel in the intermediate phase difference map corresponding to one of the plurality of quality values; generating an unwrapped intermediate phase difference map by performing phase unwrapping on the intermediate phase difference map based on the local quality map; and generating an unwrapped phase difference map by performing the phase unwrapping on the phase difference map based on the unwrapped intermediate phase difference map.

In some embodiments, the generating of the intermediate phase difference map may comprise: performing a filtering process to the phase difference map.

In some embodiments, the generating of the unwrapped intermediate phase difference map by performing the phase unwrapping on the intermediate phase difference map based on the local quality map may comprise: determining one or more pixels in the intermediate phase difference map as one or more starting seed points based on the local quality map, the one or more pixels corresponding to an optimal quality value; and marking the one or more starting seed points as one or more unwrapped points.

In some embodiments, the generating of the unwrapped intermediate phase difference map by performing the phase unwrapping on the intermediate phase difference map based on the local quality map may further comprise: performing the phase unwrapping on at least one neighbor pixel of each of the one or more starting seed points, a phase difference between at least one unwrapped neighbor pixel of each of the one or more starting seed points and each of the one or more starting seed points being less than $\pi$.

In some embodiments, the generating of the unwrapped intermediate phase difference map by performing the phase unwrapping on the intermediate phase difference map based on the local quality map may further comprise: determining the at least one unwrapped neighbor pixel of each of the starting seed points as one or more new seed points.

In some embodiments, the generating of the unwrapped intermediate phase difference map by performing the phase unwrapping on the intermediate phase difference map based on the local quality map may further comprise: determining whether the number of the seed points is less than a first threshold; performing the phase unwrapping on at least one neighbor pixel of all of the one or more new seed points in response to a determination that the number of the seed points is less than the first threshold.

In some embodiments, the generating of the unwrapped intermediate phase difference map by performing the phase unwrapping on the intermediate phase difference map based on the local quality map may further comprise: determining whether the number of the seed points is greater than a first threshold; and performing the phase unwrapping on at least one neighbor pixel of a part of the one or more new seed points based on the corresponding local quality values, in response to a determination that the number of the one or more seed points is greater than the first threshold.

In some embodiments, the generating of the unwrapped phase difference map by performing the phase unwrapping on the phase difference map based on the unwrapped intermediate phase difference map may comprise: performing the phase unwrapping on at least one pixel of the phase difference map comprising the one or more second wrapped values, a phase difference between the at least one pixel of the phase difference map and at least one pixel of the unwrapped intermediate phase difference map being less than $\pi$.

According to a second aspect of the present disclosure, a system for phase unwrapping for use in magnetic resonance imaging may include one or more storage media and one or more processors configured to communicate with the one or more storage media. The one or more storage media may include a set of instructions. When the one or more processors executing the set of instructions, the one or more processors may be directed to perform one or more of the following operations. The one or more processors may generate a plurality of phase wrapped images based on a plurality of echo signals, each phase wrapped image comprising one or more first wrapped values, and each phase wrapped image corresponding to one of the plurality of echo signals. The one or more processors may generate a phase difference map based on the plurality of phase wrapped images, the phase difference map comprising one or more second wrapped values. The one or more processors may generate an unwrapped phase difference map by unwrapping the one or more second wrapped values in the phase difference map. The one or more processors may determine a first field distribution map based on the unwrapped phase difference map. The one or more processors may generate a plurality of unwrapped phase images by unwrapping the one or more first wrapped values in each phase wrapped image based on the first field distribution map.

In some embodiments, to generate the plurality of unwrapped phase images, the one or more processors may select one of the plurality of phase wrapped images as a reference phase map. The one or more processors may determine a relative phase shift of each phase wrapped image based on the reference phase map and the first field distribution map. The one or more processors may generate a partially unwrapped phase map of each phase wrapped image based on the relative phase shift of each phase wrapped image and the reference phase map. The one or more processors may generate a baseline phase map based on the reference phase map and the partially unwrapped phase map of each phase wrapped image. The one or more processors may generate the plurality of unwrapped phase images based on the baseline phase map and the partially unwrapped phase map of each phase wrapped image.

In some embodiments, the one or more processors may generate a second field distribution map based on the baseline phase map, the reference phase map and the partially unwrapped phase map of each phase wrapped image.

In some embodiments, to generate the unwrapped phase difference map, the one or more processors may generate an intermediate phase difference map based on the phase difference map. The one or more processors may generate a local quality map based on the intermediate phase difference map, the local quality map including a plurality of quality values, and each pixel in the intermediate phase difference map corresponding to one of the plurality of quality values. The one or more processors may generate an unwrapped intermediate phase difference map by performing phase unwrapping on the intermediate phase difference map based on the local quality map. The one or more processors may generate an unwrapped phase difference map by performing the phase unwrapping on the phase difference map based on the intermediate phase difference map.

In some embodiments, to generate the unwrapped intermediate phase difference map by performing the phase unwrapping on the intermediate phase difference map based on the local quality map, the one or more processors may determine one or more pixels in the intermediate phase difference map as one or more starting seed points based on the local quality map, the one or more pixels corresponding to an optimal quality value. The one or more processors may mark the one or more starting seed points as one or more unwrapped points. The one or more processors may perform the phase unwrapping on at least one neighbor pixel of each of the one or more starting seed points.

In some embodiments, to generate the unwrapped intermediate phase difference map by performing the phase unwrapping on the intermediate phase difference map based on the local quality map, the one or more processors may determine at least one unwrapped neighbor pixel of each of the one or more starting seed points as one or more new seed points.

According to a third aspect of the present disclosure, a non-transitory computer readable medium may comprise at least one set of instructions. The at least one set of instructions may be executed by one or more processors of a computer server. The one or more processors may obtain an echo signal. The one or more processors may generate an original phase map based on the echo signal. The one or more processors may generate a phase difference map based on the original phase map. The one or more processors may generate an unwrapped phase difference map by performing phase unwrapping on the phase difference map. The one or more processors may generate an unwrapped phase map corresponding to the original phase map based on the original phase map and the unwrapped phase difference map.

In some embodiments, the generating of the unwrapped phase difference map may comprise: generating a local quality map based on the phase difference map; and performing the phase unwrapping on the phase difference map based on the local quality map.

BRIEF DESCRIPTION OF THE DRAWINGS

The present disclosure is further described in terms of exemplary embodiments. These exemplary embodiments are described in detail with reference to the drawings. The drawings are not to scale. These embodiments are non-limiting schematic embodiments, in which like reference numerals represent similar structures throughout the several views of the drawings, and wherein:

FIG. 3-A is an exemplary schematic diagram illustrating a bipolar readout gradient according to some embodiments of the present disclosure;

FIG. 3-B is an exemplary schematic diagram illustrating a monopolar readout gradient according to some embodiments of the present disclosure;

FIG. 13 is an exemplary schematic diagram illustrating a susceptibility weighted imaging of brain according to some embodiments of the present disclosure.

DETAILED DESCRIPTION

Figure 1:
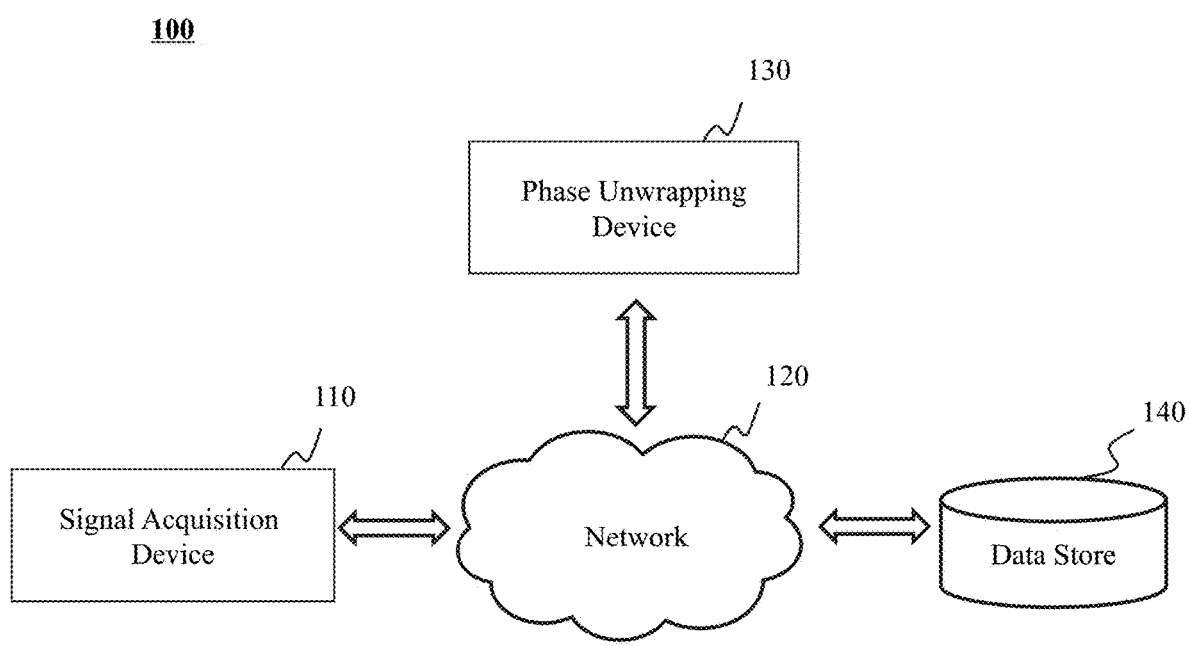
FIG. 1 is an exemplary schematic block diagram illustrating a system 100 for phase unwrapping according to some embodiments of the present disclosure.

In order to illustrate the technical solutions related to the embodiments of the present disclosure, brief introduction of the drawings referred to the description of the embodiments is provided below. Obviously, drawings described below are only some examples or embodiments of the present disclosure. Those having ordinary skills in the art, without further creative efforts, may apply the present disclosure to other similar scenarios according to these drawings. It should be understood that these examples or embodiments are provided for the purposes of illustration and comprehension, and are not intended to limit the scope of the present disclosure. Unless stated otherwise or obvious from the context, the same reference numeral in the drawings refers to the same structure and operation.

As used in the disclosure and the appended claims, the singular forms "a," "an," and "the" include plural referents unless the content clearly dictates otherwise. It will be further understood that the terms "comprises," "comprising," "includes," and/or "including" when used in the disclosure, specify the presence of stated steps and elements, but do not preclude the presence or addition of one or more other steps and elements.

Some modules of the system may be referred to in various ways according to some embodiments of the present disclosure; however, any amount of different modules may be used and operated in a client terminal and/or a server. These modules are intended to be illustrative, not intended to limit the scope of the present disclosure. Different modules may be used in different aspects of the system and method.

According to some embodiments of the present disclosure, flow charts are used to illustrate the operations performed by the system. It is to be expressly understood, the operations above or below may or may not be implemented in order. Conversely, the operations may be performed in inverted order, or simultaneously. Besides, one or more other operations may be added to the flowcharts, or one or more operations may be omitted from the flowchart.

FIG. 1 is an exemplary schematic block diagram illustrating a system 100 for phase unwrapping according to some embodiments of the present disclosure.

The phase unwrapping system 100 may include one or more signal acquisition devices 110, networks 120, phase unwrapping devices 130 and data stores 140.

The signal acquisition device 110 may be configured to acquire signals. The acquired signals may be sent to the phase unwrapping device 130 for further processing. Alternatively or additionally, the acquired signals may be stored in the data store 140. The signal acquisition device 110 may include but is not limited to a medical imaging device, a radar device, an optical signal acquisition device, etc. The medical imaging device may include but is not limited to a magnetic resonance imaging (MRI) device, etc. The signals may include but are not limited to electromagnetic waves, etc.

The phase unwrapping device 130 may be configured to generate processing results by processing and analyzing input data (e.g., signals acquired by the signal acquisition device 110 and/or signals stored in the data store 140). For example, if the signal acquisition device 110 is a magnetic resonance imaging (MRI) device, the phase unwrapping device 130 may generate an image according to the signal data. As another example, the phase unwrapping device 130 may perform phase unwrapping on the generated image.

The data store 140 may include one or more storage devices. The data store 140 may be configured to store signals and/or data acquired by the signal acquisition device 110. Alternatively or additionally, the data store 140 may be configured to store data generated by operations of the phase unwrapping device 130. The data store 140 may be local or remote. The data store 140 may include but is not limited to a hierarchical database, a network database, a relational database, or the like, or any combination thereof. The data store 140 may digitize information and then store the digitized information using electrical, magnetic or optical storage devices. The data store 140 may be configured to store various information such as procedures, data, etc. The data store 140 may store information using an electrical storage device. Exemplary electrical storage devices may be various memories, random access memories (RAMs), read only memories (ROMs), etc. The random access memories may include but are not limited to dekatrons, selectrons, delay line memories, Williams tubes, dynamic random access memories (DRAMs), static random access memories (SRAMs), thyristor random access memories (T-RAMs), zero capacitance random access memories (Z-RAMs), or the like, or any combination thereof. The read only memories may include but are not limited to bubble memories, twistor memories, film memories, plated wire memories, magnetic-core memories, drum memories, CD-ROMs, hard disks, tapes, early nonvolatile random access memories (NVRAMs), phase change memories, magneto-resistive random access memories, ferroelectric random access memories, nonvolatile SRAMs, flash memories, electrically erasable programmable read-only memories (EEPROMs), erasable programmable read only memories, programmable read only memories, mask read-only memories, floating connection gate RAMs, nano random access memories, racetrack memories, resistive random access memories, programmable metallization cells, or the like, or any combination thereof. The data store 140 may store information using a magnetic storage device. Exemplary magnetic storage devices may be hard disks, floppy disks, tapes, magnetic core memories, bubble memories, USB flash disks, flash memories, etc. The data store 140 may store information using an optical storage device such as a CD, a DVD, etc. The data store 140 may store information using a magneto-optical storage device such as a magneto-optical disk, etc. The access method of the data store 140 may be random storage, serial access storage, read only storage, or the like, or any combination thereof. The data store 140 may or may not be a permanent memory storage. It should be noted that the above-mentioned storage devices are merely for the purposes of illustration, and are not intended to limit the scope of the types of the database that may be used in the phase unwrapping system 100.

The network 120 may be a single network, or a combination of networks. For example, the network 120 may include but is not limited to a local area network (LAN), a wide area network (WAN), a public network, a private network, a wireless local area network (WLAN), a virtual network, a metropolitan area network (MAN), a public switched telephone network (PSTN), or the like, or any combination thereof. The network 120 may include multiple network access points such as a wired or wireless access point, a base station, a network switch point, etc. Data sources may be connected to the network 120 through the access points and transmit information via the network 120.

It should be noted that the above description of the phase unwrapping system is provided for the purposes of illustration, and is not intended to limit the scope of the present disclosure. For persons having ordinary skills in the art, modules may be combined in various ways, or connected with other modules as sub-systems. Various variations and modifications may be conducted under the teaching of the present disclosure. However, those variations and modifications may not depart the spirit and scope of this disclosure. For example, the data store 140 may be a cloud-computing platform with data storage functions. The cloud-computing platform may include but is not limited to a public cloud, a private cloud, a community cloud, a hybrid cloud, etc. All such modifications are within the protection scope of the present disclosure.

Figure 2:
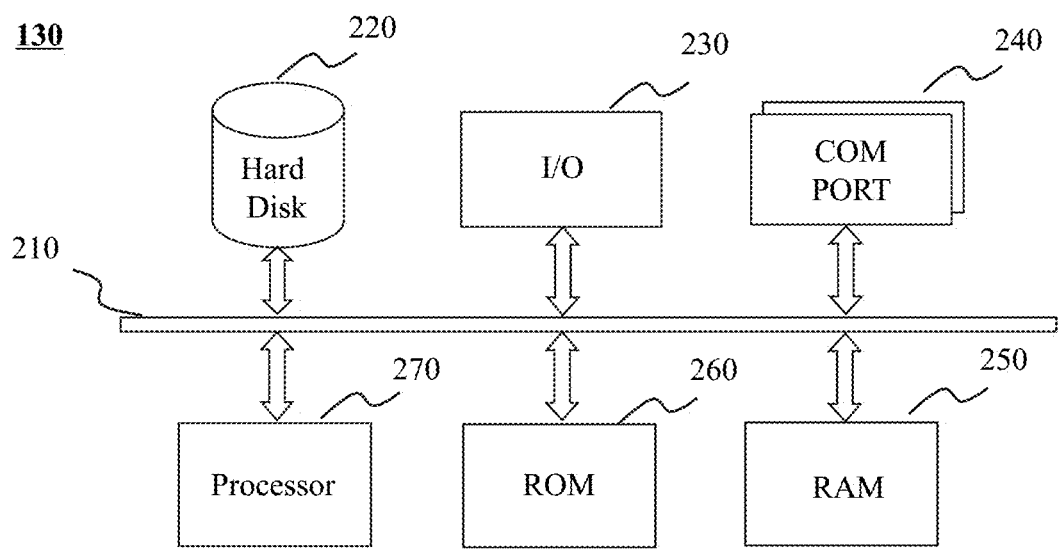
FIG. 2 illustrates a structure of a computing device according to some embodiments of the present disclosure.

FIG. 2 illustrates a structure of a computing device according to some embodiments of the present disclosure. The computing device may be configured to implement the phase unwrapping device 130 and other components of the system 100. The computer may be a computer with general or specific functions. The phase unwrapping device 130 may be implemented by hardware, software, firmware, or any combination thereof of the computing device. For brevity, FIG. 2 depicts only one computer. The functions of the computer, providing information that the phase unwrapping device 130 may require, may be implemented by a group of similar platforms in a distributed mode to disperse the processing load of the system.

The computer may include a COM PORT (a communication port) 240 that may connect with a network that may implement data communication. The computer may include one or more processors 270 that is configured to execute program instructions. The processor 270 may include one or more processing components or devices (e.g., a hardware processor) such as a central processing unit (CPU), a digital signal processor (DSP), a system on a chip (SoC), a microcontroller unit (MCU), etc. In some embodiments, the processor 270 may be a specially designed processing component or device with special functions.

In some embodiments, the processor 270 may be a server or a server group. The server group may be centralized (e.g., a data center) or distributed (e.g., a distributed system). The processor 270 may be a cloud server, a file server, a database server, an FTP server, an application server, a proxy server, a mail server, or the like, or any combination thereof. The server may be local or remote. In some embodiments, the server may access information stored in the data store 140 (e.g., signal data stored in the data store 140), information acquired by the signal acquisition device 110 (e.g., signal data acquired by the signal acquisition device 110), etc.

The computer may include an internal communication bus 210, different types of program storage units and data storage units (e.g., a hard disk 220, a ROM 260, a RAM 250) configured to store various data files applicable to computer processing and/or communication, and some possible program instructions executed by the processor 270. The computer may also include an I/O 230 that may support the communication of data and/or information between the computer and external (e.g., a user). In some embodiments, the I/O 230 may input data to the processor 270. In some embodiments, the I/O 230 may receive data output by the processor 270 and show the output data in forms of digitals, characters, images, voices, etc. In some embodiments, the I/O 230 may include but is not limited to an input device, an output device, or the like, or any combination thereof. The input device may include but is not limited to a character input device (e.g., a keyboard), an optical reading device (e.g., an optical mark reader, an optical character reader, etc.), a graphic input device (e.g., a mouse, an operating rod, a light pen, etc.), an image input device (e.g., a camera, scanner, a fax machine, etc.), an analog input device (e.g., a language analog-to-digital conversion recognition system), or the like, or any combination thereof. The output device may include but is not limited a display device, a printing device, a plotter, an image output device, a voice output device, a magnetic recording device, or the like, or any combination thereof. The computer may accept programs and data via a communication network.

For brevity, the description of the methods and/or systems of phase unwrapping may take magnetic resonance imaging (MRI) as an example. It should be noted that the methods and/or systems of phase unwrapping described below are merely some examples or implementations. For persons having ordinary skills in the art, the methods and/or systems of phase unwrapping in the present disclosure may be applied to other similar situations such as radar signal processing, optical signal processing, etc.

Magnetic resonance (MR) may refer to a nuclear physics phenomenon in which energy level splitting of nuclear magnetic moments of a substance occurs under the action of a main magnetic field, and energy level transition of nucleus occurs under an energy condition of an external radio frequency (RF) pulse. In MRI, under the action of a main magnetic field, an RF pulse, and a gradient magnetic field imposed on a scanned object, an MRI device may acquire echo signals. The scanned object may include but is not limited to a human body, an animal, a non-living object, etc. The echo signal acquired by the MRI device may be represented as a complex signal. The complex signal may include but is not limited to amplitude information and phase information of the signal at a spatial position. For example, the complex echo signal acquired by the MRI device may be denoted as:

$$S(r)=M(r)e^{-i\emptyset(r)}, \quad (1)$$

where r may represent a spatial position, for example, a spatial position of a pixel or a voxel in an image; $S(r)$ may represent the complex signal at the spatial position r; $M(r)$ may represent the amplitude of the signal at the spatial position r; $\emptyset(r)$ may represent the phase of the signal at the spatial position r; and i may be an imaginary unit.

MR amplitude imaging may be an imaging method utilizing amplitude information of signals at spatial locations. MR phase imaging may be an imaging method utilizing phase information of signals at spatial locations. In MR phase imaging, the phase information may be extracted from an echo signal using an inverse trigonometric function. Thus, the phase information may be stored within a range of $2\pi$ such as $(-\pi, \pi]$, $(0, 2\pi]$, etc. If an actual phase exceeds this range, the storage value of the phase will be wrapped into the range. Therefore, the phase information obtained from the echo signal using an inverse trigonometric function may be wrapped into a range of $2\pi$, and lead to an error of $2n\pi$ (n may be a signed nonzero integer). The quality of an image generated according to the phase information may be affected by the phase wrapping. For example, a wrapping artifact may be formed in the image. To reduce and/or avoid the wrapping artifact, the wrapped phase may be recovered to a true phase value by performing phase unwrapping.

In some embodiments, according to the method of generating echoes, the echoes may include but are not limited to spin echoes, gradient echoes, etc. According to the number of echoes generated during a time period, the MRI may include but is not limited to single echo imaging, multi-echo imaging, etc. The time period may be a time interval between two neighbor RF pulses imposed on a scanned object. If one echo is generated during the time period, the MRI may be single echo imaging. If two or more echoes may be generated during the time period, the MRI may be multi-echo imaging.

For brevity, the description of the methods and/or systems of phase unwrapping may take MR multi-echo gradient echo imaging as an example. It should be noted that the methods and/or systems of phase unwrapping described below are merely some examples or implementations. For persons having ordinary skills in the art, the methods and/or systems of phase unwrapping in the present disclosure may be applied to other similar situations, such as single echo gradient echo imaging, gradient echoes planar imaging, spin echo imaging, steady-state free precession imaging, etc.

In the MRI, an echo sequence may include but is not limited to one or more RF pulses, slice selection gradients, encoding gradients, echoes, etc. The RF pulse may be used to flip nucleus magnetization vector of a detection target in a scanned object by a certain angle (e.g., 45°, 90°, etc.). The detection target may be an entire or a portion of the scanned object. For example, the detection target may include an organ, an organization, a lesion site, a tumor site, or the like, or any combination thereof. More specifically, the detection target may be head, chest, abdomen, heart, liver, upper limb, lower limb, spine, skeleton, blood vessel, or the like, or any combination thereof. The slice-selection gradient may be used to select the imaging plane of the detection target. The encoding gradient may be used to perform spatial encoding operation for the nucleus in the detection target. In two-dimensional imaging, the encoding gradient may include two encoding gradients such as a frequency encoding gradient (or a readout gradient) and a phase encoding gradient. In three-dimensional imaging, the encoding gradient may include three encoding gradients such as two frequency encoding gradients (or readout gradients) and a phase encoding gradient.

For a gradient echo sequence, the readout gradient may be used for spatial encoding. Alternatively or additionally, the readout gradient may also be used to generate an echo. The gradient echo may refer to a signal echo that is formed using a gradient magnetic field polarity reversal method. In some embodiments, the readout gradient may include but is not limited to a monopolar readout gradient, a bipolar readout gradient, etc. The monopolar readout gradient may refer to that the polarities of readout gradients imposed on two neighbor echoes are same. The bipolar readout gradient may refer to that the polarities of readout gradients imposed on two neighbor echoes are opposite.

FIG. 3-A and FIG. 3-B are exemplary schematic diagrams illustrating a bipolar readout gradient and a monopolar readout gradient according to some embodiments of the present disclosure. Partial elements (e.g., readout gradient, echo, etc.) of the gradient echo sequence may be depicted in FIG. 3-A and FIG. 3-B. As shown in FIG. 3-A and FIG. 3-B, four echoes (e.g., 302, 304, 306, 308, or 312, 314, 316, 318) are generated during a time period. As shown in FIG. 3-A, four gradients imposed on the four echoes (e.g., 302, 304, 306, 308) may be labeled as 301, 303, 305, and 307, respectively. The polarities of the readout gradients imposed on two neighbor echoes may be opposite. Thus, the readout gradients shown in FIG. 3-A may be designated as bipolar readout gradients. As shown in FIG. 3-B, four gradients imposed on the four echoes (e.g., 312, 314, 316, 318) may be labeled as 311, 313, 315, and 317, respectively. The polarities of the readout gradients imposed on two neighbor echoes may be the same. Thus, the readout gradients shown in FIG. 3-B may be designated as monopolar readout gradients.

For brevity, the description of the methods and/or systems of phase unwrapping may take monopolar readout gradients as an example. It should be noted that the methods and/or systems of phase unwrapping described below are merely some examples or implementations. For persons having ordinary skills in the art, the methods and/or systems of phase unwrapping in the present disclosure may be applied to other similar situations such as bipolar readout gradients, etc.

Figure 4:
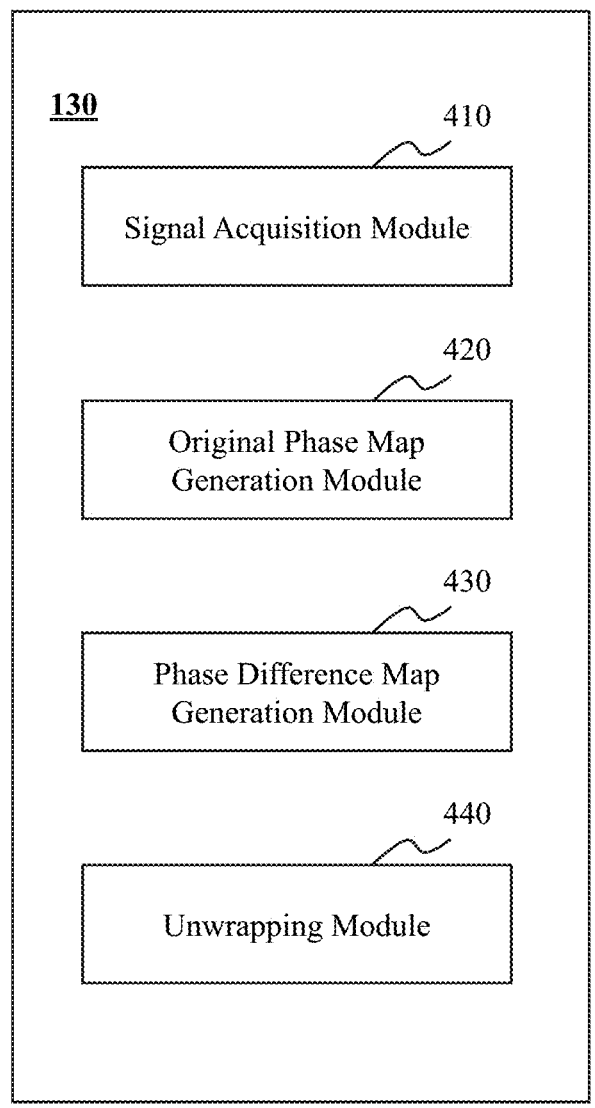
FIG. 4 is an exemplary schematic diagram illustrating a phase unwrapping device 130 according to some embodiments of the present disclosure.

FIG. 4 is an exemplary schematic diagram illustrating a phase unwrapping device 130 according to some embodiments of the present disclosure. The phase unwrapping device 130 may include but is not limited to a signal acquisition module 410, an original phase map generation module 420, a phase difference map generation module 430, and an unwrapping module 440.

The signal acquisition module 410 may be configured to obtain a plurality of echo signals. In some embodiments, the signal acquisition module 410 may obtain the echo signals from the signal acquisition device 110 and/or the storage device (e.g., the data store 140).

The original phase map generation module 420 may be configured to generate a plurality of original phase maps (e.g., also referred to as phase wrapped images) according to the echo signals. The original phase map may comprise one or more first wrapped values corresponding to the phase of the echo signal. For single echo imaging, one echo may be generated during a time period. Thus, the original phase map generation module 420 may generate an original phase map corresponding to the echo according to the echo signal. For multi-echo imaging, two or more echoes may be generated during a time period and different echoes may correspond to different echo times (TE). The echo time may refer to a time interval between the center of first RF pulse imposed on the scanned object and the center of an echo. The original phase map generation module 420 may generate original phase maps corresponding to different echoes during the time period according to the echo signals. For example, assuming that five echoes labeled as echo 1, echo 2, echo 3, echo 4, and echo 5 are generated during a time period, and the echo times corresponding to the echoes are labeled as $TE_1$, $TE_2$, $TE_3$, $TE_4$, and $TE_5$, respectively. The original phase map generation module 420 may generate an original phase map corresponding to echo 1, an original phase map corresponding to echo 2, an original phase map corresponding to echo 3, an original phase map corresponding to echo 4, and/or an original phase map corresponding to echo 5.

The phase difference generation module 430 may be configured to generate a phase difference map according to the echo signals. The phase difference map may be relevant with the difference between phases corresponding to any two different echoes during a time period. The phase difference map may comprise one or more second wrapped values. The second wrapped value, different from the first wrapped value, may be related to the phase difference between at least two echo signals.

The unwrapping module 440 may be configured to generate a plurality of unwrapped phase maps (e.g., also referred to as unwrapped phase images) by performing phase unwrapping on the plurality of original phase maps. For multi-echo imaging, the unwrapping module 440 may generate unwrapped phase maps corresponding to different echoes during a time period. The phase of all echoes corresponding to the unwrapped phase map may be unwrapped.

In some embodiments, two or more modules of modules 410-440 may be integrated in a hardware device or two or more independent hardware devices. It may be understood that the modules 410-440 may be implemented using various methods. For example, the modules may be implemented by hardware, software, or a combination thereof. More specifically, in some embodiments, the modules may be implemented by a semiconductor such as a large scale integrated circuit or gate array, a logic chip, a transistor, etc., a hardware circuit of a programmable hardware device such as a field programmable gate array, a programmable logic device, etc. In some embodiments, the modules may be implemented by a software executed by various processors. In some embodiments, the modules may be implemented by a combination of the hardware circuit and the software (e.g., firmware).

It should be noted that the above description of the phase unwrapping device 130 is provided for the purposes of illustration, and is not intended to limit the scope of the present disclosure. For persons having ordinary skills in the art, the phase unwrapping device 130 may be modified or altered in forms and details, or make several simple deduction or substitution, or some modules may be adjusted or combined without inventive work under the teaching of the present disclosure. However, those modifications and alterations are within the scope of the above description. For example, the phase unwrapping device 130 may further include a storage module. The storage module may be configured to store data generated by each module of the phase unwrapping device 130, e.g., echo signals obtained by the signal acquisition module 410, original phase maps generated by the original phase map generation module 420, phase difference maps generated by the phase difference map generation module 430, unwrapped phase maps generated by the unwrapping module 440, etc. In some embodiments, multiple modules may share one storage module. In some embodiments, each module may have a respective storage module. As another example, the phase difference map generation module 430 may be omitted.

Figure 5:
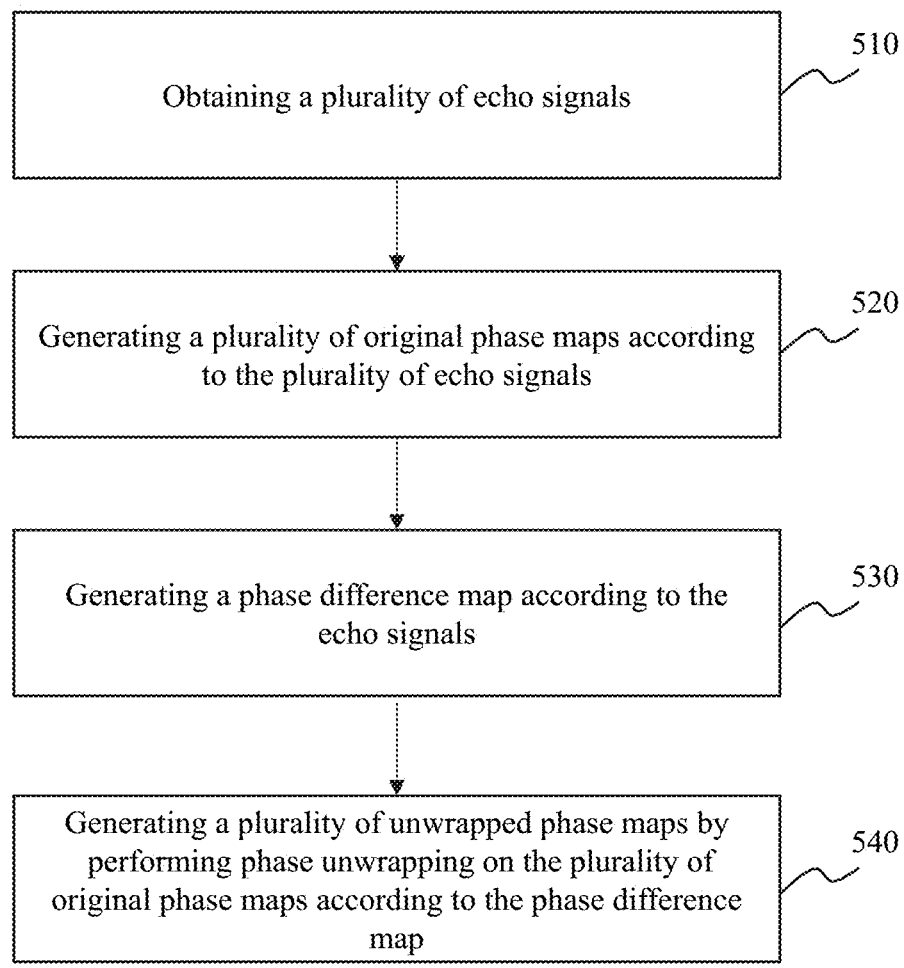
FIG. 5 is a flowchart illustrating an exemplary process of generating an unwrapped phase map according to some embodiments of the present disclosure.

FIG. 5 is a flowchart illustrating an exemplary process of generating an unwrapped phase map according to some embodiments of the present disclosure.

In step 510, the signal acquisition module 410 may obtain a plurality of echo signals. In some embodiments, the signal acquisition module 410 may obtain the echo signals from the signal acquisition device 110 and/or the storage device (e.g., the data store 140).

In step 520, the original phase map generation module 420 may generate a plurality of original phase maps according to the plurality of echo signals. In some embodiments, the original phase map may be a two-dimensional image or a three-dimensional image. For multi-echo imaging, the original phase generation module 420 may generate original phase maps corresponding to different echoes during a time period. The method of generating original phase maps may include but is not limited to a single channel imaging, a multi-channel imaging, etc. For multi-channel imaging, the original phase map generation module 420 may generate phase maps corresponding to each channel according to the echo signals acquired by each channel. The original phase map generation module 420 may then merge the phase maps corresponding to each channel into one original phase map. In some embodiments, the original phase map generation module 420 may merge the phase maps corresponding to each channel into one original phase map according to weight of each channel. In some embodiments, for multi-echo imaging, the original phase map generation module 420 may generate phase maps corresponding to different echoes of each channel according to the echo signals acquired by each channel. The original phase map generation module 420 may then merge the phase maps corresponding to the same echo of each channel into one original phase map corresponding to the echo. The original phase map generation module 420 may also generate original phase maps corresponding to different echoes. In some embodiments, the original phase map generation module 420 may generate phase maps corresponding to different echo times simultaneously or in sequence.

In step 530, the phase difference map generation module 430 may generate a phase difference map according to the echo signals. In some embodiments, for multi-echo imaging, two or more echoes may be generated during a time period. The phase difference map may refer to a phase map associated with a difference of phase information between two echoes during a time period. For example, assuming that three echoes labeled as echo 1, echo 2, echo 3 are generated during a time period, and the echo times corresponding to the three echoes are labeled as $TE_1$, $TE_2$, and $TE_3$, respectively. The phase difference map may refer to a phase map associated with the difference of phase information between echo 1 and echo 2, or echo 2 and echo 3, or echo 1 and echo 3. In some embodiments, one phase difference map may correspond to one echo time difference. The echo time difference may refer to an absolute value of an echo time difference between two echoes corresponding to the phase difference map. For example, the echo time difference of the phase difference map associated with the difference of phase information between echo 1 and echo 2 may be expressed as $\Delta TE_1$, wherein $\Delta TE_1 = |TE_1 - TE_2|$. In some embodiments, the phase difference maps with same echo time difference may be merged into one phase difference map using an average method. In some embodiments, the process of generating phase difference map may include: selecting two echoes during a time period; dividing complex signals of the two echoes and generating a divided result; extracting phase difference information of the two echoes from the divided result; and generating the phase difference map according to the phase difference information of the two echoes. In some embodiments, the method of extracting phase difference information may include but is not limited to an inverse trigonometric function method. Thus, the phase difference map generated according to the extracted phase difference information using the inverse trigonometric function method may cause phase wrapping. For example, assuming the phase difference map is generated according to echo 1 and echo 2, the complex signal of echo 1 may be expressed as equation (2). And the complex signal of echo 2 may be expressed as equation (3). In addition, the divided result may be expressed as equation (4):

$$S_1(r) = M_1(r)e^{-i\emptyset_1(r)}, \quad (2)$$

$$S_2(r) = M_2(r)e^{-i\emptyset_2(r)}, \quad (3)$$

$$\frac{S_2(r)}{S_1(r)} = \frac{M_2(r)}{M_1(r)} e^{-i(\emptyset_2(r) - \emptyset_1(r))}, \quad (4)$$

wherein r may represent a spatial position, for example, a spatial position of a pixel or a voxel in an image; $S_1(r)$ may represent the complex signal of echo 1 at the spatial position r; $M_1(r)$ may represent the amplitude of the signal of echo 1 at the spatial position r; $\emptyset_1(r)$ may represent the phase of the signal of echo 1 at the spatial position r; $S_2(r)$ may represent the complex signal of echo 2 at the spatial position r; $M_2(r)$ may represent the amplitude of the signal of echo 2 at the spatial position r; $\emptyset_2(r)$ may represent the phase of the signal of echo 2 at the spatial position r; and i may be an imaginary unit.

In some embodiments, for imaging using multi-channel receiver coil, the phase difference map generation module 430 may first generate phase difference maps corresponding to each channel. The phase difference maps corresponding to each channel may be merged into one phase difference map according to weights of each channel. For example, one channel may correspond to one spatial sensitivity, and the weight of the channel may be expressed as a ratio of the spatial sensitivity of the channel to a sum of the spatial sensitivities of all channels. The intensity of the MR signal generated by a detection target received by a channel may be related to the spatial position of the detection target relative to the channel. The spatial sensitivity of the channel may refer to distinction in signal intensities due to the spatial positions.

In step 540, the unwrapping module 440 may generate a plurality of unwrapped phase maps by performing phase unwrapping on the plurality of original phase maps according to the phase difference map. In MR phase imaging, phase information may be extracted from the echo signals by solving an inverse trigonometric function. Thus, the phase may be stored within a range of $2\pi$, such as $(-\pi, \pi]$, $(0, 2\pi]$, etc. If the actual value of a phase exceeds this range, the storage value of the phase will be wrapped into the range. Therefore, the phase information obtained from the echo signals using an inverse trigonometric function may be wrapped into the range of $2\pi$, and lead to an error of $2n\pi$ (n is a signed nonzero integer). The quality of images generated according to the phase information (e.g., an original phase map) may be affected by the phase wrapping. For example, a wrapping artifact may be formed in an image. To reduce and/or avoid the wrapping artifact, the wrapped phase may be recovered to the true phase by performing phase unwrapping. The principle of phase unwrapping may be to restore the correct phase by adding or subtracting an integer multiple of $2\pi$. In some embodiments, the method of phase unwrapping may include but is not limited to a pixel-based region growing method and an image-based global minimum norm method.

In some embodiments, steps 520 and 530 may be performed simultaneously. In some embodiments, step 520 may be performed before or after step 530.

In some embodiments, the process of generating unwrapped phase maps is not based on the phase difference maps. Thus, step 530 may be omitted in the process 500.

Figure 6:
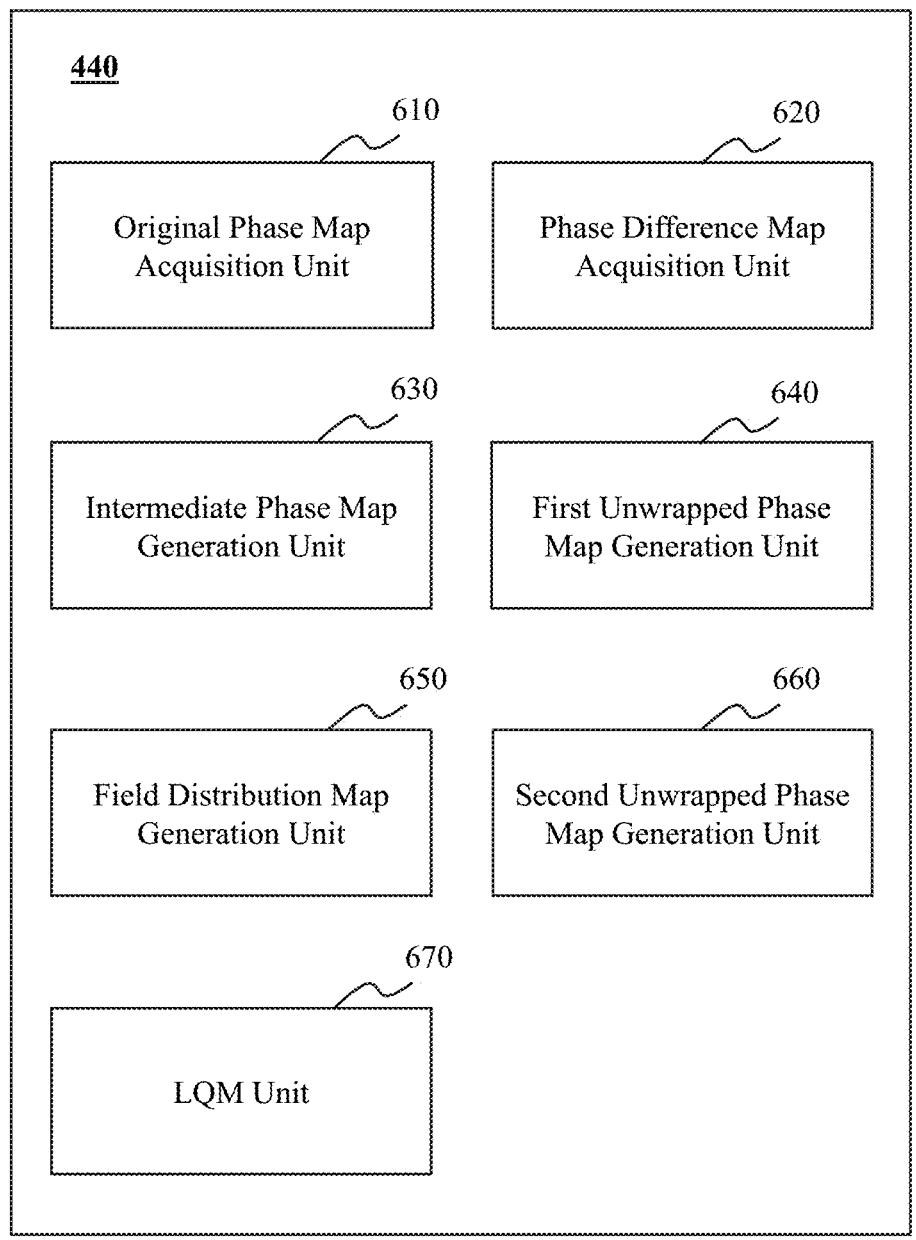
FIG. 6 is an exemplary schematic diagram illustrating an unwrapping module 440 according to some embodiments of the present disclosure.

FIG. 6 is an exemplary schematic diagram illustrating an unwrapping module 440 according to some embodiments of the present disclosure. The unwrapping module 440 may include but is not limited to an original phase map acquisition unit 610, a phase difference map acquisition unit 620, an intermediate phase map generation unit 630, a first unwrapped phase map generation unit 640, a field distribution map generation unit 650, and a second unwrapped phase map generation unit 660.

The original phase map acquisition unit 610 may be configured to obtain an original phase map. In some embodiments, the original phase map acquisition unit 610 may obtain the original phase map from the original phase map generation module 420 and/or the storage device (e.g., the data store 140, the storage module in the phase unwrapping device 130, etc.). For multi-echo imaging, two or more echoes may be generated during a time period, and the original phase map acquisition unit 610 may obtain original phase maps corresponding to different echoes during a time period.

The phase difference map acquisition unit 620 may be configured to obtain a phase difference map. In some embodiments, the phase difference map acquisition unit 620 may obtain the phase difference map from the phase difference map generation module 430 and/or the storage device (e.g., the data store 140, the storage module in the phase unwrapping device 130, etc.).

The intermediate phase map generation unit 630 may generate an intermediate phase map according to the phase difference map or the original phase map. The intermediate phase map may refer to a phase map obtained by processing the phase difference map or the original phase map. The processing may include but is not limited to smoothing, filtering, etc. The filtering may include but is not limited to a high-pass filtering, a low-pass filtering, etc. The low-pass filtering may include but is not limited to a sphere mean value (SMV) low-pass filtering.

The first unwrapped phase map generation unit 640 may be configured to perform phase unwrapping on a single phase map (e.g., a phase difference image or an original phase corresponding any echo) based on a region growing unwrapping algorithm.

The field distribution map generation unit 650 may be configured to generate a first field distribution map according to the unwrapped phase difference map. The field distribution map may include a local field, a background field, etc. The local field may be caused by the susceptibility of an internal tissue of the scanned object. The background field may be caused by the inhomogeneity of the main magnetic field imposed on the scanned object. In some embodiments, the first field distribution map may be approximate values of the actual field distribution map.

The second unwrapped phase map generation unit 660 may be configured to generate an unwrapped phase map according to the first field distribution map and the original phase map.

The Local Quality Map (LQM) generation unit 670 may be configured to generate a local quality map based on a phase map (e.g., an original phase map, or a phase difference map). The local quality map may include a plurality of quality values. The quality value of a pixel or a voxel in the local quality map may represent the quality of the pixel or the voxel in the phase map.

In some embodiments, two or more units of units 610-670 may be integrated into a hardware device or two or more independent hardware devices. It may be understood that the units 610-670 may be implemented using various methods. For example, the units may be implemented by hardware, software, or a combination thereof. More specifically, in some embodiments, the units may be implemented by a semiconductor such as a large scale integrated circuit or gate array, a logic chip, a transistor, etc., a hardware circuit of a programmable hardware device such as a field programmable gate array, a programmable logic device, etc. In some embodiments, the units may be implemented by software executed by various processors. In some embodiments, the units may be implemented by a combination of the hardware circuit and the software (e.g., firmware). It should be noted that the above description of the unwrapping module 440 is provided for the purposes of illustration, and is not intended to limit the scope of the present disclosure. For persons having ordinary skills in the art, the unwrapping module 440 may be modified or altered in forms and details, or make several simple deduction or substitution, or some units may be adjusted or combined without inventive work under the teaching of the present disclosure. However, those modifications and alterations are within the scope of the above description. For example, the phase difference map acquisition unit 620 and/or the field distribution map generation unit 650 may be omitted.

Figure 7A:
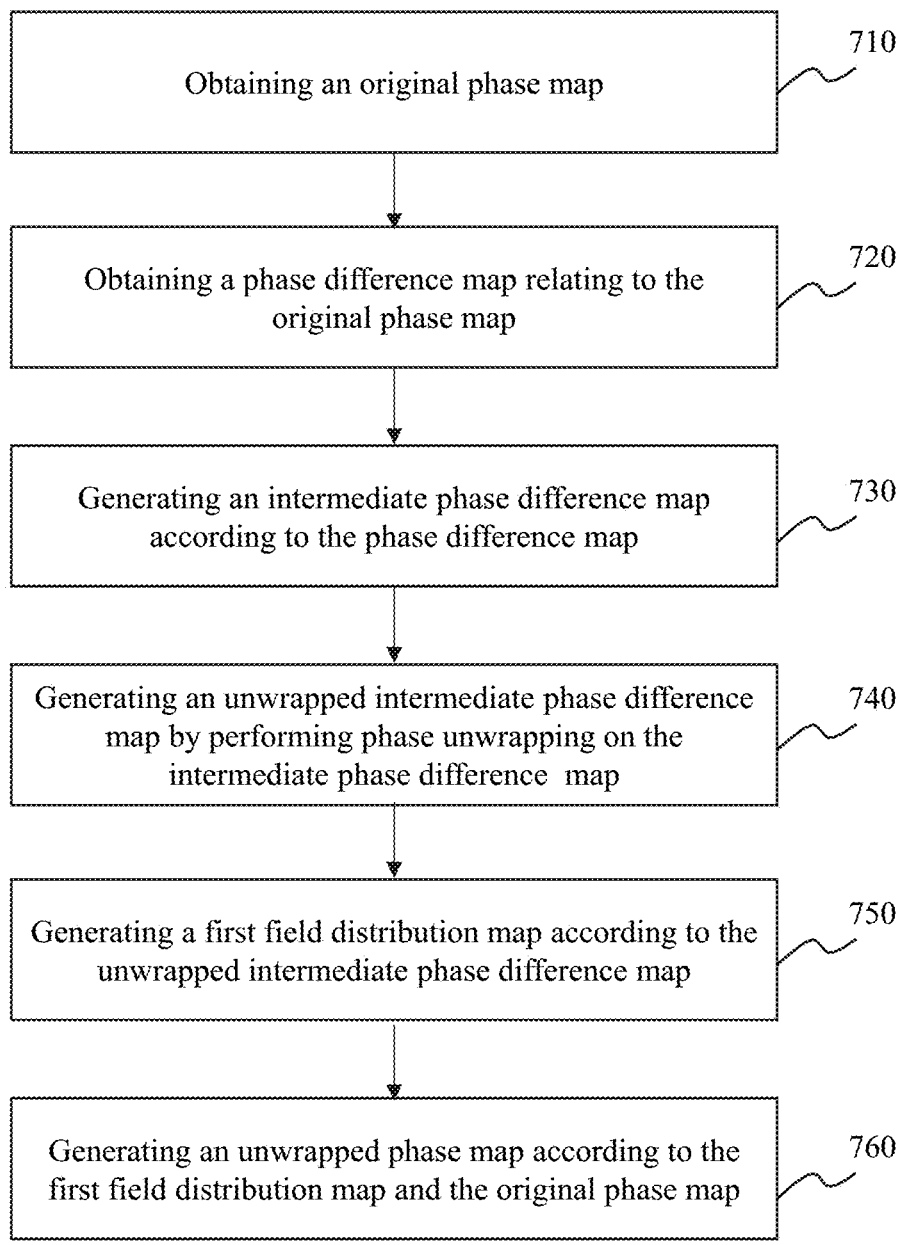
FIG. 7A is a flowchart illustrating an exemplary process of generating an unwrapped phase map according to some embodiments of the present disclosure.

FIG. 7A is a flowchart illustrating an exemplary process of generating an unwrapped phase map according to some embodiments of the present disclosure. In some embodiments, the process 700-1 may be configured to generate an unwrapped phase map illustrated in step 540.

In step 710, the original phase map acquisition unit 610 may obtain an original phase map. In some embodiments, the original phase map acquisition unit 610 may obtain the original phase map from the original phase map generation module 420 and/or the storage device (e.g., the data store 140, the storage module in the phase unwrapping device 130, etc.), the original phase map may comprise one or more phase with one or more first wrapped values. For multi-echo imaging, two or more echoes may be generated during a time period, and the original phase map acquisition unit 610 may obtain original phase maps corresponding to different echoes during a time period.

In step 720, the phase difference map acquisition unit 620 may obtain a phase difference map relating to the original phase map, and the phase difference map may comprise one or more second wrapped values. In some embodiments, the second wrapped value may be related to a phase difference value corresponding to two original phase maps. In some embodiments, for multi-echo imaging, two or more echoes may be generated during a time period, and the phase difference map may refer to a phase map associated with phase difference between two echoes during a time period. In some embodiments, the phase difference map acquisition unit 620 may obtain the phase difference map from the phase difference map generation module 430 and/or the storage device (e.g., the data store 140, the storage module in the phase unwrapping device 130, etc.). In some embodiments, the phase difference map may comprise one or more phase with one or more second wrapped values different from the first wrapped values.

In step 730, the intermediate phase map generation unit 630 may generate an intermediate phase difference map according to the phase difference map. In some embodiments, phase difference information of the phase difference map may be obtained using an inverse trigonometric function. Therefore, the phase difference information of the phase difference map may have phase wrapping, and phase unwrapping may be performed on the phase difference map. In some embodiments, the method of phase unwrapping may include but is not limited to a pixel-based region growing method, an image-based global minimum norm method, etc. The two methods of phase unwrapping may be based on the spatial continuity assumption. For example, it may be assumed that the phase difference between neighbor pixels or neighbor voxels in the phase map is less than $\pi$. However, for conditions that the signal-noise ratios are limited, for example, high-resolution imaging or some imaging areas with low signal-noise ratios (e.g., air-tissue boundaries in the detection target), the spatial continuity of the phase may be reduced or destroyed by the additional phase information due to the noise, resulting in an erroneous unwrapping result. Thus, the phase difference map may need to be processed to improve the spatial continuity of the phases in the phase difference map and/or the signal-noise ratios of the phase difference map. And an accurate phase unwrapping result may be obtained.

The method of generating the intermediate phase map may include but is not limited to smoothing, filtering, etc. The filtering may include but is not limited to a low-pass filtering, a high-pass filtering, etc. The low-pass filtering may include but is not limited to a sphere mean value (SMV) low-pass filtering, etc.

In step 740, the first unwrapped phase map generation unit 640 may generate an unwrapped intermediate phase difference map by performing phase unwrapping on the intermediate phase difference map. In some embodiments, there are no phase wraps in the unwrapped intermediate phase difference map. In some embodiments, the method of phase unwrapping may include but is not limited to a pixel-based region growing method, an image-based global minimum norm method, etc.

In step 750, the field distribution map generation unit 650 may generate a first field distribution map according to the unwrapped intermediate phase difference map. In some embodiments, there may be a linear relationship between the field distribution map and the unwrapped intermediate phase difference map. The field distribution map may include a local field, a background field, etc. The local field may be caused by the susceptibility of an internal tissue of the scanned object. The background field may be caused by the inhomogeneity of the main magnetic field imposed on the scanned object. In some embodiments, the first field distribution map may be an approximation of the actual field distribution map. The method of generating the first field distribution map may include generating the first field distribution map according to the linear relationship and the unwrapped intermediate phase difference map. More specifically, in step 750, the field distribution map generation unit 650 may generate the first field distribution map according to the linear relationship and the unwrapped intermediate phase difference map.

For example, the linear relationship between the field distribution map and the accurate unwrapped phase map may be expressed as:

$$\varphi_S(r) = \varphi_0(r) + \gamma \Delta B(r) t, \quad (5)$$

wherein r may represent a spatial position, for example, spatial position of a pixel or voxel in the image; $\varphi_S(r)$ may represent the accurate unwrapped phase map; $\Delta B(r)$ may represent a relative field distribution map on the basis of the main magnetic field; t may represent an echo time corresponding to the phase map; γ may represent a gyromagnetic ratio of proton; and generally, the gyromagnetic ratio of proton may be a known value, $\varphi_0(r)$ may represent a baseline phase map; and generally, the baseline phase may be a constant and unknown value for each pixel or voxel.

In some embodiments, the intermediate phase difference map in step 730 may be generated according to a phase difference map. Thus, the unwrapped intermediate phase difference map in step 740 and 750 may be expressed as:

$$\Delta \varphi'_{uw}(r) \approx \gamma \Delta B(r) \cdot \Delta TE + \varepsilon, \quad (6)$$

wherein $\Delta \varphi'_{uw}(r)$ may represent the unwrapped intermediate phase difference map; ΔTE may represent echo time difference corresponding to the unwrapped intermediate phase difference map; and ε may represent the total effect of noise and other errors.

According to equation (6), the first field distribution map may be expressed as:

$$\Delta B_{first}(r) \approx \Delta \varphi'_{uw}(r) / \gamma \Delta TE, \quad (7)$$

wherein $\Delta B_{first}(r)$ may represent the first field distribution map. The first field distribution map may be an approximation of the field distribution map.

In step 760, the second unwrapped phase map generation unit 660 may generate an unwrapped phase map according to the first field distribution map and the original phase map. In some embodiments, there are no phase wraps in the unwrapped phase map. In some embodiments, for multi-echo imaging, two or more echoes may be generated during a time period, and the second unwrapped phase map generation unit 660 may generate unwrapped phase maps corresponding to different echoes during a time period.

In some embodiments, step 710 may be simultaneously performed with steps 720, 730, 740, 750. In some embodiments, step 710 may be performed before steps 720, 730, 740, 750.

In some embodiments, the method of generating unwrapped phase maps may be not based on the phase difference map. Thus, steps 720 and 750 may be omitted in the process 700-1. If the method of generating unwrapped phase maps is not based on the phase difference map, in step 730, the intermediate phase map generation unit 630 may generate the intermediate phase map according to the original phase map. For multi-echo imaging, two or more echoes may be generated during a time period, and the intermediate phase map generation unit 630 may generate intermediate phase maps corresponding to the original phase map of different echoes. In step 760, the second unwrapped phase map generation unit 660 may generate the unwrapped phase map according to the unwrapped intermediate phase map and the original phase map. In some embodiments, the second unwrapped phase map generation unit 660 may restore the correct phase by adding an integer multiple of 2π to the phase information in the original phase map or subtracting an integer multiple of 2π from the phase information in the original phase map. Specifically, the second unwrapped phase map generation unit 660 may determine a phase shift of the original phase map according to the original phase map and the unwrapped intermediate phase map, and generate the unwrapped phase map according to the phase shift. For example, for multi-echo imaging, assuming that three echoes are generated during a time period, labeled as echo 1, echo 2, echo 3. The echo times corresponding to the three echoes may be labeled as $TE_1$, $TE_2$, $TE_3$. In step 710, the original phase map acquisition unit 610 may obtain original phase map $\varphi_i(r)$ corresponding to echo i (i=1, 2, 3). In step 730, the intermediate phase map generation unit 630 may generate intermediate phase map $\varphi'_i(r)$ corresponding to echo i according to the original phase map $\varphi_i(r)$ corresponding to echo i. In step 740, the first unwrapped phase map generation unit 640 may generate unwrapped intermediate phase map $\varphi'_{i\_uw}(r)$ corresponding to echo i according to the intermediate phase map $\varphi'_i(r)$ corresponding to echo i. In step 760, the unwrapped phase map generation unit 760 may generate unwrapped phase map $\varphi_{i\_uw}(r)$ corresponding to echo i according to the unwrapped intermediate phase map $\varphi'_{i\_uw}(r)$ corresponding to echo i. In some embodiments, the method of generating the unwrapped phase map corresponding to echo i may be expressed as:

$$\varphi_{i\_uw}(r) = \varphi_i(r) - \left[ \frac{\varphi_i(r) - \varphi'_{i\_uw}(r)}{2\pi} \right] * 2\pi \quad (i = 1, 2, 3), \quad (8)$$

wherein [ ] may represent the rounding operator.

Figure 7B:
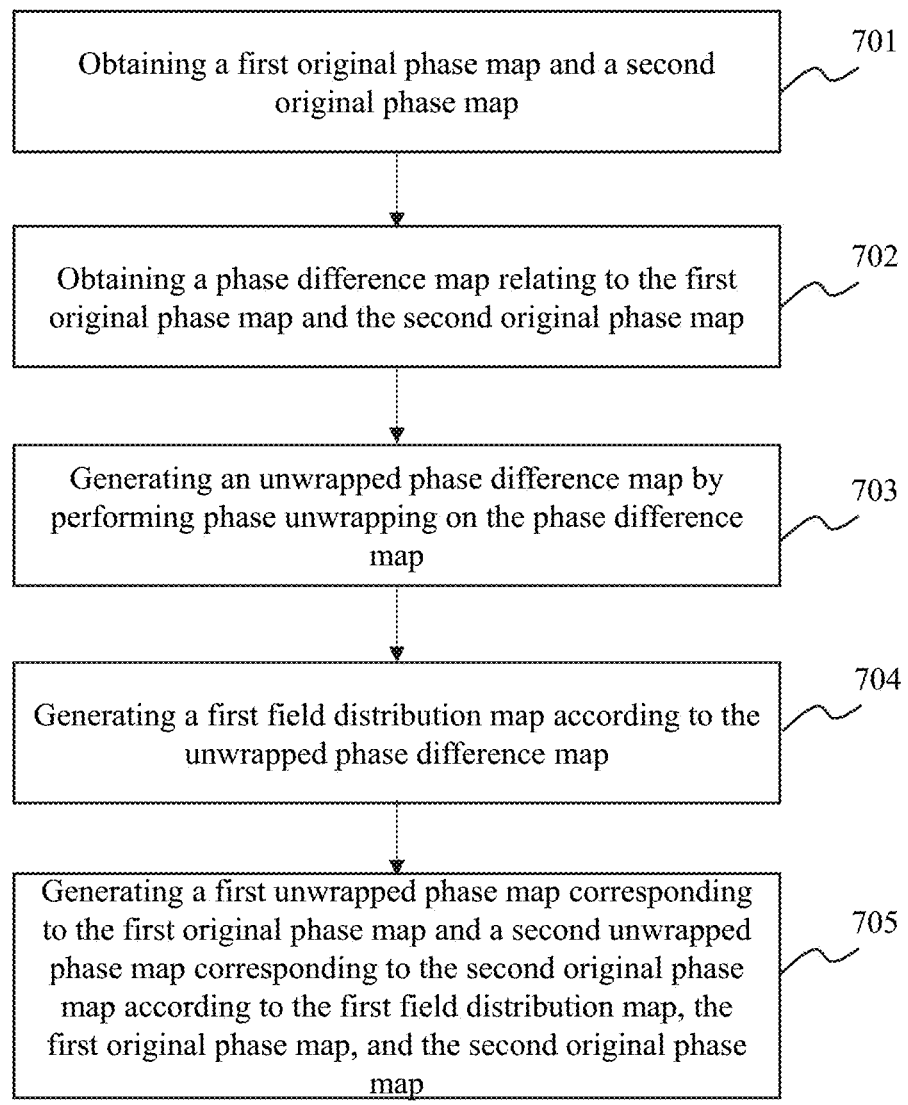
FIG. 7B is a flowchart illustrating another exemplary process of generating an unwrapped phase map according to some embodiments of the present disclosure.

FIG. 7B is a flowchart illustrating another exemplary process of generating an unwrapped phase map according to some embodiments of the present disclosure. In some embodiments, the process 700-1 may be configured to generate an unwrapped phase map illustrated in step 540.

In step 701, the original phase map acquisition unit 610 may obtain a first original phase map and a second original phase map. In some embodiments, the first original phase map and/or the second original phase map may comprise phase with one or more first wrapped values. The process of obtaining the first original phase map and the second original phase map in step 701 may be same as the process of obtaining the original phase map in step 710 of FIG. 7A.

In step 702, the phase difference map acquisition unit 620 may obtain a phase difference map relating to the first original phase map and the second original phase map. In some embodiments, the phase difference map may comprise phase with one or more second wrapped values. The process of obtaining the phase difference map relating to the first original phase map and the second original phase map in step 702 may be same as the process of obtaining the difference phase map relating to the original phase map in step 720 of FIG. 7A.

In step 703, the first unwrapped phase map generation unit 640 may generate an unwrapped phase difference map by performing phase unwrapping on the phase difference map (e.g., by unwrapping the one or more second wrapped values in the phase difference map). In some embodiments, there are no second wrapped value or phase wraps in the unwrapped phase difference map. An intermediate phase difference map may be determined first based on the phase difference map. The first unwrapped phase map generation unit 640 may generate an unwrapped intermediate phase difference map by performing phase unwrapping on the intermediate phase difference map based on a proposed region growing algorithm. The first unwrapped phase map generation unit 640 may generate the unwrapped phase difference map based on the unwrapped intermediate phase difference map. The first unwrapped phase map generation unit 640 may perform the phase unwrapping on at least one pixel or voxel of the phase difference map by adding an integer multiple of $2\pi$ to the phase values of the at least one pixel or voxel of the phase difference map or subtracting an integer multiple of $2\pi$ from the phase values of the at least one pixels or voxels of the phase difference map so that the phase difference between the at least one pixel or voxel of the phase difference map and at least one pixel or voxel of the unwrapped intermediate phase difference map may be less than $\pi$.

In step 704, the field distribution map generation unit 650 may generate a first field distribution map according to the unwrapped phase difference map. The process of generating the first field distribution map according to the unwrapped phase difference map in step 704 may be same as the process of generating the first field distribution map according to the unwrapped phase difference map in step 750 of FIG. 7A.

In step 705, the second unwrapped phase map generation unit 660 may generate a first unwrapped phase map corresponding to the first original phase map and a second unwrapped phase map corresponding to the second original phase map based on the first original phase map, the second original phase map, and the first field distribution map. The second unwrapped phase map generation unit 660 may generate the first unwrapped phase map and the second unwrapped phase map by unwrapping the one or more first wrapped values in the first original phase map and the second original phase map based on the first field distribution map. In some embodiments, there are no wrapped value or phase wraps in the first unwrapped phase map and/or the second unwrapped phase map. The process of generating the first unwrapped phase map and the second unwrapped phase map in step 705 may be same as the process of generating the unwrapped phase map in step 760 of FIG. 7A.

Figure 8:
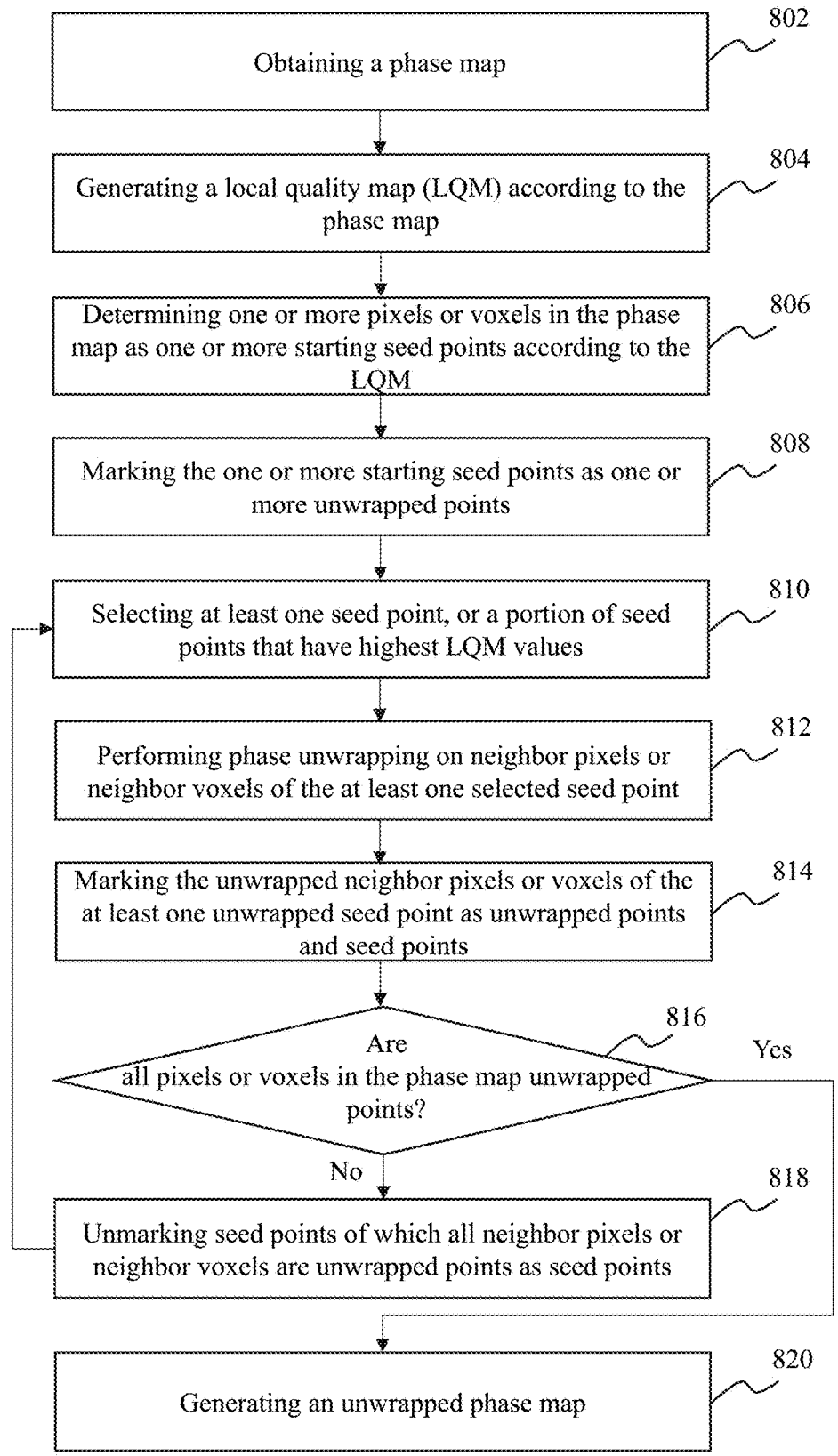
FIG. 8 is a flowchart illustrating an exemplary process of generating an unwrapped phase map based on a proposed region growing algorithm according to some embodiments of the present disclosure.

FIG. 8 is a flowchart illustrating an exemplary process of generating an unwrapped phase map based on a proposed region growing algorithm according to some embodiments of the present disclosure according to some embodiments of the present disclosure. In some embodiments, the method of generating unwrapped phase maps may include but is not limited to a pixel-based region growing method, an image-based global minimum norm method, etc. The process 800 may take the pixel-based region growing method as an example to illustrate the process of performing phase unwrapping on a phase map (e.g., an original phase map, a phase difference map, or an intermediate phase difference map).

In step 802, the first unwrapped phase map generation unit 640 may obtain a phase map (e.g., an original phase map, a phase difference map, or an intermediate phase difference map). In some embodiments, the first unwrapped phase map generation unit 640 may obtain the phase map from the original phase map acquisition unit 610, the phase difference map acquisition unit 620, the intermediate phase map generation unit 630, and/or the storage device (e.g., the data store 140, the storage module in the phase unwrapping device 130, etc.).

In step 804, a local quality map may be generated by the Local Quality Map generation unit 670 according to the phase map. The local quality map may include a plurality of quality values. The quality value of a pixel or a voxel in the local quality map may represent the quality of the pixel or the voxel in the phase map. In some embodiments, the Local Quality Map generation unit 670 may determine the quality value of the pixel or voxel according to a signal-noise ratio and/or a standard deviation. In some embodiments, the meaning of the quality value in the local quality map may depend on the determination method of the quality value. For example, if the quality value is determined according to the standard deviation, the less the quality value of a pixel or a voxel is, the higher the quality of the pixel or the voxel is. If the quality value is determined according to the signal-noise ratio, the larger the quality value of a pixel or a voxel is, the higher the quality of the pixel or the voxel is. In some embodiments, the Local Quality Map generation unit 670 may determine the quality value of a pixel or a voxel according to the pixel or the voxel and its neighbor pixels or neighbor voxels in the phase map. The Local Quality Map generation unit 670 may also determine the quality value of a pixel or a voxel according to its neighbor pixels or neighbor voxels in the phase map. For example, assuming that the criteria of describing the quality of a pixel or a voxel is the signal-noise ratio, the Local Quality Map generation unit 670 may determine the quality value of the pixel or the voxel according to the signal-noise ratio of the pixel or the voxel and the signal-noise ratio of its neighbor pixels or neighbor voxels in the phase map. The Local Quality Map generation unit 670 may also determine the quality value of a pixel or a voxel according to the signal-noise ratio of the neighbor pixels or neighbor voxels of the pixel or the voxel in the phase map. In some embodiments, the neighbor pixels or neighbor voxels may include neighbor pixels and/or neighbor voxels on at least one dimension in one dimension, two dimension, and three dimension. In some embodiments, for a two-dimension phase map, a pixel may be represented as a rectangle, and one of the sides of the neighbor pixels may coincide with one of the sides of the pixel. Under this circumstance, the neighbor pixels of the pixel may include 4 pixels. Alternatively, at least one point of the neighbor pixels may coincide with at least one point of the pixel. Under this circumstance, the neighbor pixels of the pixel may include 8 pixels. For a three-dimension phase map, a voxel may be represented as a cuboid, and one of the surfaces of the neighbor voxels of the voxel may coincide with one of the surfaces of the voxel. Under this circumstance, the neighbor voxels of the voxel may include 6 voxels. Alternatively, at least one side of the neighbor voxels of the voxel may coincide with at least one side of the voxel. Under this circumstance, the neighbor voxels of the voxel may include 18 voxels. Alternatively, at least one point of the neighbor voxels of the voxel may coincide with at least one point of the voxel. Under this circumstance, the neighbor voxels of the voxel may include 26 voxels. In some embodiments, the method of generating local quality map may include but is not limited to a quadratic variance mean method, etc.

In step 806, the local quality map may determine one or more pixels or voxels in the phase map as one or more starting seed points according to the local quality map. In some embodiments, an unwrapped phase map may be generated according to the principle of performing phase unwrapping preferentially on one or more pixels or voxels with high quality. Thus, the local quality map may determine one or more pixels or voxels with an optimal quality as one or more starting seed points.

In step 808, the local quality map may mark the one or more starting seed points as one or more unwrapped points. In some embodiments, the unwrapped point may represent that the phase unwrapping has been performed on the pixel or the voxel.

In step 810, the first unwrapped phase map generation unit 640 may select at least one seed point. In some embodiments, the first unwrapped phase map generation unit 640 may select all seed points to perform the phase unwrapping. In some embodiments, the first unwrapped phase map generation unit 640 may select a portion of the seed points to perform the phase unwrapping. The phase unwrapping on a seed point may refer to performing the phase unwrapping on neighbor pixels or neighbor voxels of the seed point. For example, the first unwrapped phase map generation unit 640 may select a portion of seed points using a seed prioritizing method to perform phase unwrapping during each iteration. Merely by way of example, the first unwrapped phase map generation unit 640 may determine whether the number of seed points is greater than a first threshold (e.g., 1000). If the number of seed points during an iteration is less than or equal to the first threshold, the first unwrapped phase map generation unit 640 may select all seed points to perform the phase unwrapping. If the number of seed points during an iteration is greater than the first threshold, the first unwrapped phase map generation unit 640 may select a portion of seed points to perform the phase unwrapping. For example, according to the principle of performing phase unwrapping preferentially on a pixel or a voxel with high quality, the first unwrapped phase map generation unit 640 may sort all seed points by corresponding quality value, and then select seed points with the top 10% quality value among all seed points to perform the phase unwrapping. The unselected seed points will be reserved onto the next iteration until eventually become selected. As another example, the first unwrapped phase map generation unit 640 may select seed points of which the quality values are greater than a quality threshold to perform the phase unwrapping.

In step 812, the first unwrapped phase map generation unit 640 may perform phase unwrapping on neighbor pixels or neighbor voxels of the selected seed points. In some embodiments, the first unwrapped phase map generation unit 640 may simultaneously perform phase unwrapping on the neighbor pixels or neighbor voxels of the selected seed points. Alternatively or additionally, the first unwrapped phase map generation unit 640 may perform phase unwrapping on the neighbor pixels or neighbor voxels of the selected seed points in sequence. In some embodiments, according to the principle of performing phase unwrapping preferentially on a pixel or a voxel with high quality, the first unwrapped phase map generation unit 640 may perform the phase unwrapping on the neighbor pixels or neighbor voxels of the selected seed points in sequence according to the quality of the selected seed points (e.g., from high to low).

In some embodiments, if one neighbor pixel or one neighbor voxel of a seed point has been marked as an unwrapped point, the phase unwrapping may not need to be performed on the neighbor pixel or neighbor voxel. If one neighbor pixel or one neighbor voxel of the seed point has not been marked as an unwrapped point, the first unwrapped phase map generation unit 640 may perform the phase unwrapping on the neighbor pixel or neighbor voxel. The method of phase unwrapping may include but is not limited to adding an integer multiple of $2\pi$ to the phase values of the neighbor pixels or neighbor voxels or subtracting an integer multiple of $2\pi$ from the phase values of the neighbor pixels or neighbor voxels, so that the absolute value of difference between the phase of the neighbor pixel or neighbor voxel and the phase of the corresponding seed point may be less than $\pi$.

In step 814, the first unwrapped phase map generation unit 640 may mark the neighbor pixels or neighbor voxels of the unwrapped seed points as unwrapped points and seed points.

In step 816, the first unwrapped phase map generation unit 640 may determine whether all pixels or voxels in the phase map are unwrapped points. If all the pixels or voxels in the phase map are unwrapped points, the process 800 may proceed to step 820, and an unwrapped phase map may be generated. If some of the pixels or voxels in the phase map are not unwrapped points, the process 800 may proceed to step 818.

In step 818, the first unwrapped phase map generation unit 640 may unmark a seed point of which all neighbor pixels or neighbor voxels are unwrapped points as a seed point. After step 818, process 800 may proceed a next iteration process, and the first unwrapped phase map generation unit 640 may select at least one seed point to perform the phase unwrapping (810). During each iteration process (except for the first iteration process), the selected seed points may be different from the selected seed points in the last iteration process. Because in the last iteration process, the first unwrapped phase map generation unit 640 may mark the neighbor pixels or neighbor voxels of the unwrapped seed points as new seed points, and/or unmark the seed point of which all neighbor pixels or neighbor voxels are unwrapped points as the seed point. For example, in the first iteration process, the selected seed point may include a starting seed point. In the second iteration process, the selected seed points may include the neighbor pixels or neighbor voxels of the starting seed point and may not include the starting seed point.

In some embodiments, the phase map is generated based on the original phase map. For multi-echo imaging, the phase map may include an original phase map corresponding to at least one echo during a time period. The first unwrapped phase map generation unit 640 may generate an unwrapped phase map corresponding to one echo according to the process 800.

Figure 9:
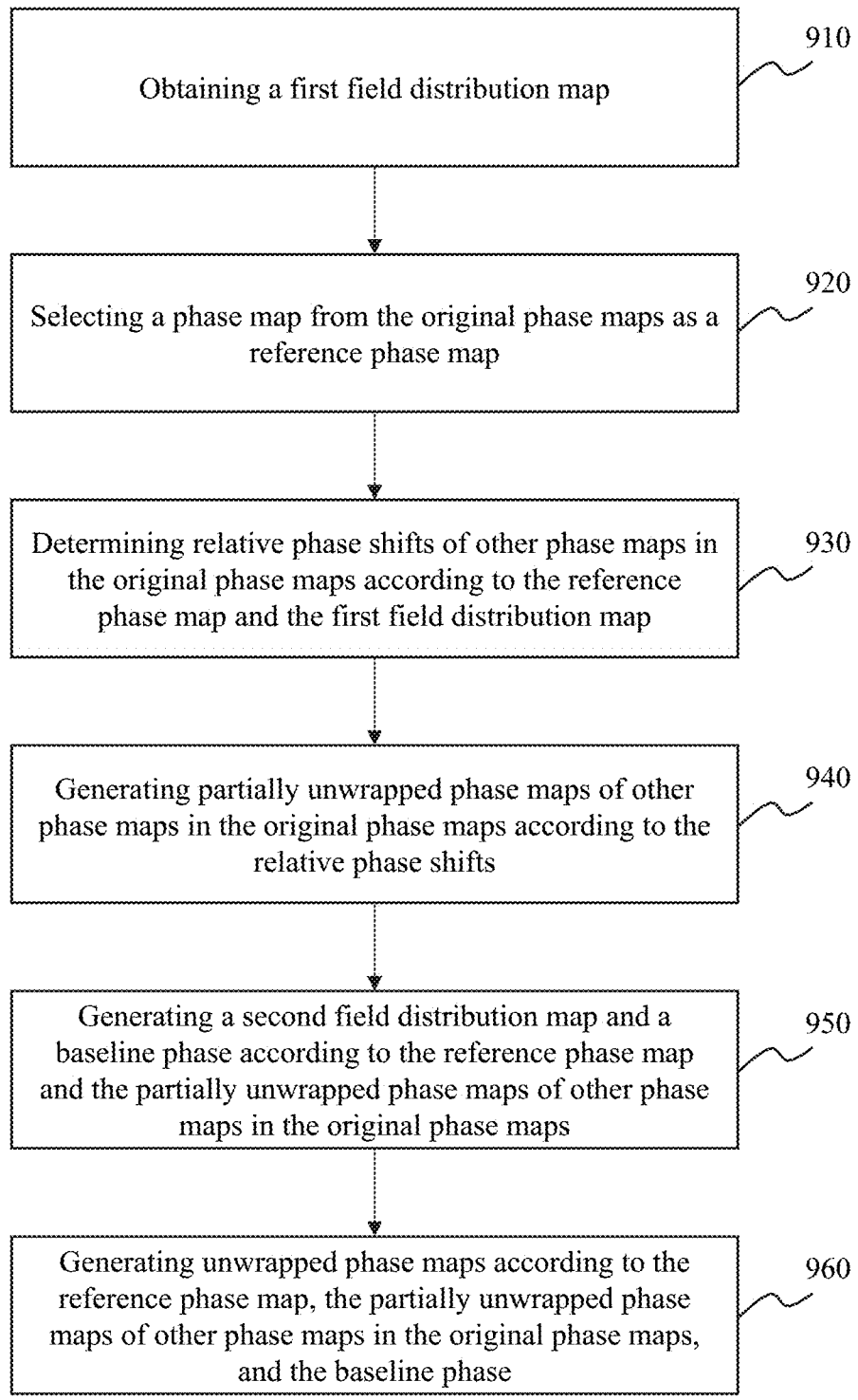
FIG. 9 is a flowchart illustrating an exemplary process of generating an unwrapped phase map according to some embodiments of the present disclosure.

FIG. 9 is a flowchart illustrating an exemplary process of generating an unwrapped phase map according to some embodiments of the present disclosure. In some embodiments, the process 900 may be configured to generate the unwrapped phase map in step 760.

In step 910, the second unwrapped phase map generation unit 660 may obtain a first field distribution map. In some embodiments, the second unwrapped phase map generation unit 660 may obtain the first field distribution map from the field distribution generation unit 650 and/or the storage device (e.g., the data store 140, the storage module in the phase unwrapping device 130).

In step 920, the second unwrapped phase map generation unit 660 may select a phase map from the original phase maps as a reference phase map. The reference phase map may be used to determine the relative phase shift of other phase maps in the original phase maps.

In step 930, the second unwrapped phase map generation unit 660 may determine relative phase shifts of other phase maps in the original phase maps according to the reference phase map and the first field distribution map. The relative phase shifts may represent partially phase shifts of other phase maps in the original phase maps. For example, for multi-echo imaging, assuming n echoes are generated during a time period, the original phase map of echo i may be expressed as:

$$\varphi_i(r) = \varphi_0(r) \gamma \Delta B_{first}(r) TE_i + \varepsilon \quad (i=1,2,\ldots,n), \quad (9)$$

wherein $\varphi_i(r)$ may represent the original phase map of echo i; $\Delta B_{first}(r)$ may represent the first field distribution map; and $TE_i$ may represent the echo time corresponding to echo i.

The original phase map of echo 1 may be determined as the reference phase map. And according to equations (9) and (10), the relative phase shifts of other phase maps in the original phase maps may be determined as:

$$\Delta\varphi_j(r) = \left[\frac{\varphi_1(r) + \gamma\Delta B_{first}(r)(TE_j - TE_1) - \varphi_j(r)}{2\pi}\right] * 2\pi (j=1,2,\ldots,n), \quad (10)$$

wherein $\Delta\varphi_j(r)$ may represent the relative phase shifts of other phase maps in the original phase maps; $\Delta B_{first}(r)$ may represent the first field distribution map; [ ] may represent a rounding operator.

In some embodiments, the relative phase shifts may be an integer multiple of $2\pi$. In some embodiments, although the first field distribution map is an approximation, the tolerance range corresponding to the rounding operation may eliminate and/or weaken the influence of errors in the first field distribution map on determining the relative phase shifts.

In step 940, the second unwrapped phase map generation unit 660 may generate partially unwrapped phase maps of other phase maps in the original phase maps according to the relative phase shifts. In some embodiments, the second unwrapped phase map generation unit 660 may generate the partially unwrapped phase maps by adding the relative phase shifts to the original phase map or subtracting the relative phase shifts from the original phase map. For example, the partially unwrapped phase maps of other phase maps in the original maps may be expressed as:

$$\varphi_{j\_puw}(r) = \varphi_j(r) + \Delta\varphi_j(r)(j=2,3,\ldots,n), \quad (11)$$

wherein $\varphi_{j\_puw}(r)$ may represent the partially unwrapped phase maps of other phase maps in the original maps.

In some embodiments, the phase wrapping pattern in the partially unwrapped phase maps of other phases in the original phase maps may be similar to or same as the phase wrapping pattern in the reference phase map. The phase difference between the partially unwrapped phase maps of other phase maps in the original phase maps and the reference phase map may be a true phase difference.

In step 950, the second unwrapped phase map generation unit 660 may generate a second field distribution map and a baseline phase map according to the reference phase map and the partially unwrapped phase maps of other phase maps in the original phase maps. Further, the second field distribution map may be more accurate than the first field distribution map. For example, assuming that n echoes are generated during a time period, the second unwrapped phase map generation unit 660 may determine the baseline phase map and the second field distribution map according to equation (12):

$$\varphi_0(r) + \gamma\Delta B_{second}(r)\begin{pmatrix}TE_1\\TE_2\\\vdots\\TE_n\end{pmatrix} = \begin{pmatrix}\varphi_{1\_puw}(r)\\\varphi_{2\_puw}(r)\\\vdots\\\varphi_{n\_puw}(r)\end{pmatrix}, \quad (12)$$

wherein $\Delta B_{second}(r)$ may represent the second field distribution map.

In equation (12), the partially unwrapped phase map of the reference phase map may be equal to the corresponding original phase map. For example, assuming that the original phase map of echo 1 is determined as the reference phase map, then $\varphi_{1\_puw} = \varphi_1(r)$.

In step 960, the second unwrapped phase map generation unit 660 may generate unwrapped phase maps according to the reference phase map, the partially unwrapped phase maps of other phase maps in the original phase maps, and the baseline phase map. For example, assuming that n echoes are generated during a time period, the second unwrapped phase map generation unit 660 may determine the unwrapped phase map according to equation (13):

$$\varphi_{i\_uw}(r) = \varphi_{i\_puw}(r) - \varphi_0(r)(i=1,2,\ldots,n) \quad (13)$$

wherein $\varphi_{i\_uw}(r)$ may represent the unwrapped phase map corresponding to echo i.

In some embodiments, the partially unwrapped phase map of the reference phase map may be equal to the original phase map. For example, assuming that the original phase map of echo 1 may be determined as the reference phase map, then $\varphi_{1\_puw}(r) = \varphi_1(r)$.

It should be noted that the above description of the process of generating the unwrapped phase map is provided for the purposes of illustration, and is not intended to limit the scope of the present disclosure. For persons having ordinary skills in the art, the specific implement method of generating the unwrapped phase map may be modified or altered in forms or details, or make several simple deduction or substitution, or some steps may be adjusted or combined without inventive work under the teaching of the present disclosure. However, those modifications and alterations are within the scope of the above description. For example, step 910 may be performed after step 920 and before step 930, or step 910 may be simultaneously performed with step 920.

In some embodiments, if a bipolar readout gradient is applied to the gradient echo sequence, there may be a phase deviation between two neighbor echoes, because the polarity of the readout gradient imposed on the two neighbor echoes are opposite. Therefore, if the phase unwrapping method described in the present disclosure is applied to the gradient echo sequence including a bipolar readout gradient, the phase deviation between two neighbor echoes may first be processed, and then the phase unwrapping may be performed using the method described in the present disclosure. Alternatively, the phase unwrapping may be performed on the odd echoes and the even echoes respectively using the method described in the present disclosure.

Figure 10:
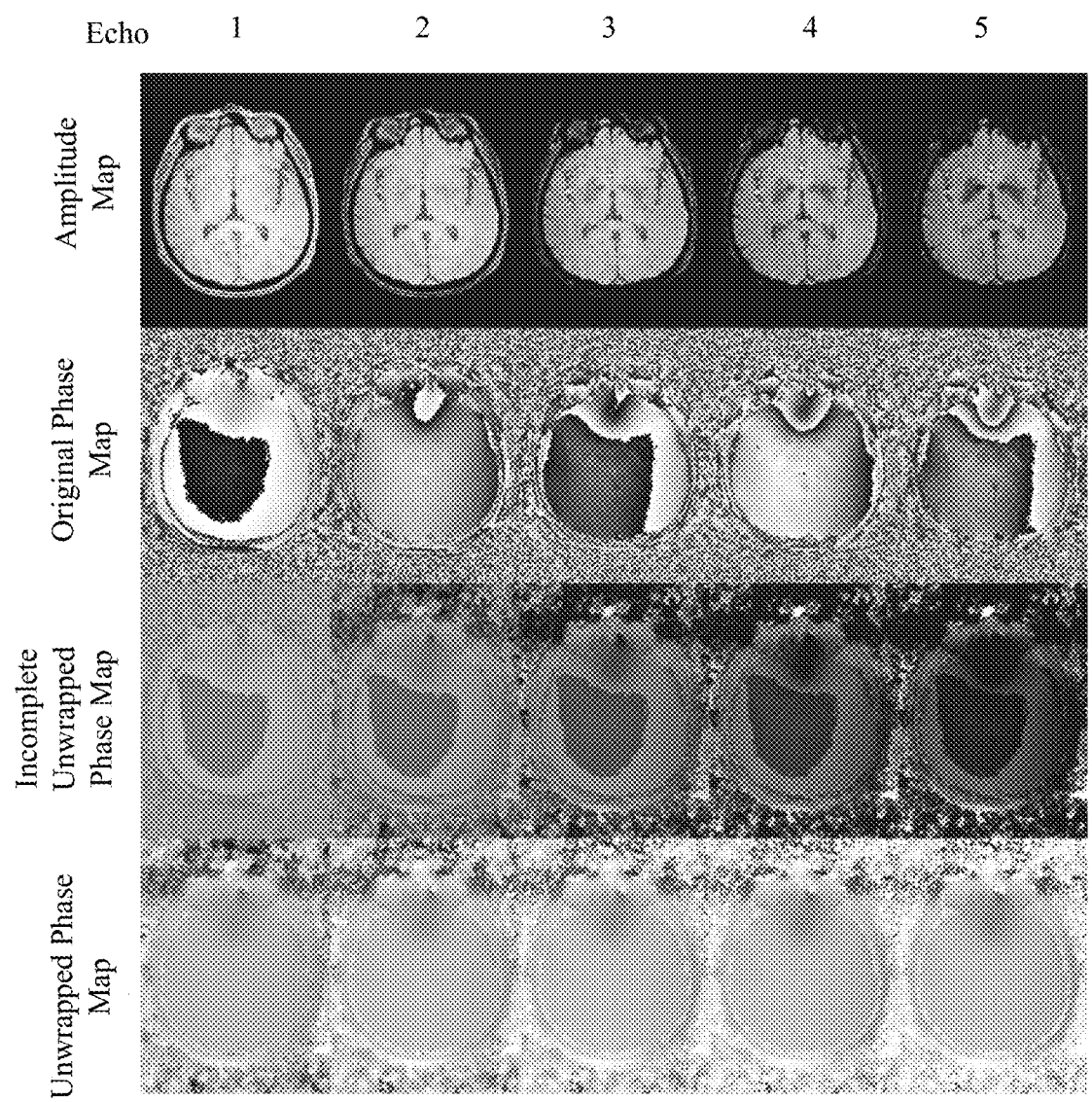
FIG. 10 is an exemplary schematic diagram illustrating amplitude maps and phase maps of each stage corresponding to different echoes in the multi-echo gradient echo MR imaging of brain according to some embodiments of the present disclosure.

FIG. 10 is an exemplary schematic diagram illustrating amplitude maps and phase maps of each stage corresponding to different echoes in the multi-echo gradient echo MR imaging of brain according to some embodiments of the present disclosure. In the embodiment, five echoes may be generated during a time period. FIG. 10 shows amplitude maps, original phase maps, partially unwrapped phase maps, and unwrapped phase maps corresponding to echo 1 to echo 5. The partially unwrapped phase maps and the unwrapped phase maps corresponding to echo 1 to echo 5 in FIG. 10 may be generated using the method described in the present disclosure (e.g., the process 500, the process 700-1, the process 700-2, the process 900, etc.) As shown in FIG. 10, the original phase maps corresponding to echo 1 to echo 5 have severe wrapping artifacts, indicating that the original phase maps corresponding to echo 1 to echo 5 have severe phase wrapping. In the partially unwrapped phase map corresponding to echo 1 to echo 5, there are still wrapping artifacts, but the wrapping artifacts is less severe than that in the original phase maps, indicating that the phase wrapping in the partially unwrapped phase maps corresponding to echo 1 to echo 5 is less severe than that in the original phase maps. There are nearly no wrapping artifacts in the unwrapped phase maps corresponding to echo 1 to echo 5, indicating that there is nearly no phase wrapping in the unwrapped phase map corresponding to echo 1 to echo 5.

Figure 11:
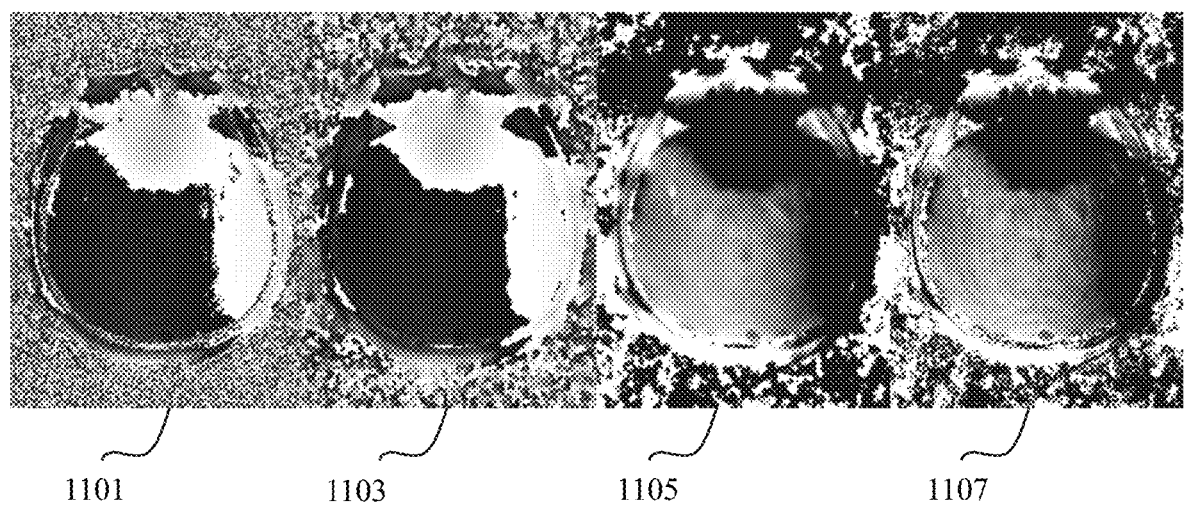
FIG. 11 is an exemplary schematic diagram illustrating phase maps of each stage during processing phase difference maps in the multi-echo gradient echo MR imaging of brain according to some embodiments of the present disclosure.

FIG. 11 is an exemplary schematic diagram illustrating phase maps of each stage during processing phase difference maps in the multi-echo gradient echo MR imaging of brain according to some embodiments of the present disclosure. The phase maps of each stage may be generated using the method described in the present disclosure (e.g., the process 700-1, the process 700-2, the process 800, etc.). As shown in FIG. 11, map 1101 may represent a phase difference map generated according to the original phase maps corresponding to two echoes. Map 1103 may represent an intermediate phase map obtained by smoothing the phase difference map. Map 1105 may represent an unwrapped intermediate phase map generated by performing phase unwrapping on the intermediate phase map. Map 1107 may represent a first field distribution map generated according to the unwrapped intermediate phase map.

Figure 12:
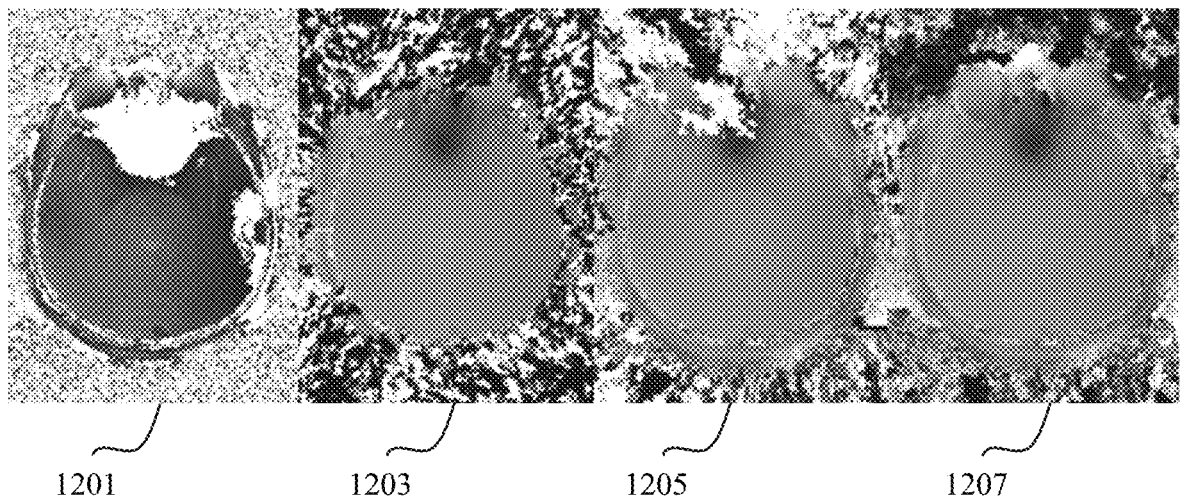
FIG. 12 is an exemplary schematic diagram illustrating unwrapped phase maps in the multi-echo gradient echo MR imaging of brain according to some embodiments of the present disclosure.

FIG. 12 is an exemplary schematic diagram illustrating unwrapped phase maps in the multi-echo gradient echo MR imaging of brain according to some embodiments of the present disclosure. Maps 1201, 1203, 1205, and 1207 may be phase maps corresponding to one echo. Map 1201 may represent an original phase map. Map 1203 may represent an unwrapped phase map generated when an intermediate phase map is not generated and the seed prioritizing method is not applied. Map 1205 may represent an unwrapped phase map generated when an intermediate phase map is generated and the seed prioritizing method is not applied. Map 1207 may represent an unwrapped phase map generated when an intermediate phase map is generated and the seed prioritizing method is applied. Map 1207 may be generated using the method described in the present disclosure (e.g., the process 500, the process 700-1, the process 700-2, the process 800, the process 900, etc.). As shown in FIG. 12, the image quality of unwrapped phase map 1203 generated when an intermediate phase map is not generated and the seed prioritizing method is not applied is not ideal. In map 1205, after the intermediate phase map is generated by phase processing, the correctness of region growing is improved, but there is still error diffusion. In map 1207, basically, non-pure noise pixels may be accurately unwrapped, and there is almost no error diffusion.

In some embodiments, the unwrapped phase map and the second field distribution map generated using the phase unwrapping method described in the present disclosure may be used for a susceptibility weighted imaging (SWI) and/or a quantitative susceptibility mapping (QSM). In classic SWI, the imaging process may include: generating amplitude maps and phase maps according to echo signals; generating processed phase maps by performing phase unwrapping on the phase maps and removing the background field; obtaining phase masks according to the processed phase maps; and generating susceptibility weighted imaging according to the phase masks and the amplitude maps. The unwrapped phase maps may be used for the classic SWI to perform phase unwrapping. The second field distribution map may be used for the classic SWI to remove the background field.

In QSM, the variation information of a local field distribution map of tissue may be obtained by using the phase information of the MRI. And a susceptibility distribution map may be obtained according to the relationship between the local field distribution map and the susceptibility. The process of the quantitative susceptibility mapping may include but is not limited to processing of the phase maps, removing of the background field, and generation of a susceptibility distribution map. The unwrapped phase maps may be used for the QSM to process the phase maps. The second field distribution map may be used for the QSM to remove the background field.

FIG. 13 is an exemplary schematic diagram illustrating a susceptibility weighted imaging of brain according to some embodiments of the present disclosure. Maps 1301-1307 may correspond to one echo. As shown in FIG. 13, map 1301 may represent a phase map processed by phase unwrapping and background field removing using a high-pass filtering method. Map 1303 may represent a susceptibility weighted imaging generated according to map 1301. Map 1305 may represent a phase map processed by phase unwrapping according to the method described in the present disclosure and background field removing according to the second field distribution map obtained in the present disclosure. Map 1307 may represent a susceptibility weighted imaging generated according to map 1305. As shown in FIG. 13, in maps 1301 and 1303, there are artifacts 1309 and 1311 in the forehead area. In maps 1305 and 1307, the artifacts 1309 and 1311 are almost disappeared.

Figure 14:
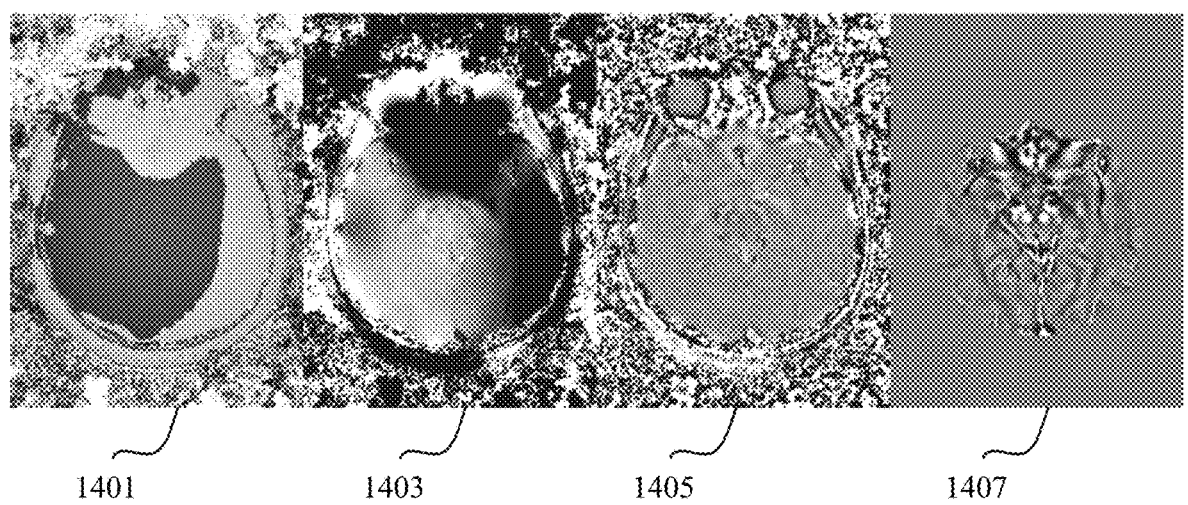
FIG. 14 is an exemplary schematic diagram illustrating a quantitative susceptibility mapping of brain according to some embodiments of the present disclosure.

FIG. 14 is an exemplary schematic diagram illustrating a quantitative susceptibility mapping of brain according to some embodiments of the present disclosure. As shown in FIG. 14, map 1401 may represent a baseline phase map. Map 1403 may represent a second field distribution map. The second field distribution map may be generated using the method described in the present disclosure (e.g., the process 900, etc.). Map 1405 may represent a local field distribution map after removing the background field of map 1403. Map 1407 may represent a quantitative susceptibility image of brain.

It may be understood to those skilled in the art that various alterations and improvements may be achieved according to some embodiments of the present disclosure. For example, the various components of the system described above are all achieved by hardware equipment. In fact, the various components of the system described above may be achieved merely by software, e.g. installing the system on the current server. Alternatively or additionally, the location information disclosed here may be provided by firmware, a combination of firmware and software, a combination of firmware and hardware, or a combination of firmware, hardware and software.

The present disclosure and/or some other examples have been described in the above. According to descriptions above, various alterations may be achieved. The topic of the present disclosure may be achieved in various forms and embodiments, and the present disclosure may be further used in a variety of application programs. All applications, modifications and alternations required to be protected in the claims may be within the protection scope of the present disclosure.

What is claimed is:

1. A method for phase unwrapping, the method being implemented on a computing device having one or more processors and one or more storage media, the method comprising:
    obtaining a plurality of echo signals representing a subject, the plurality of echo signals being formed at a plurality of different echo times;
    generating a plurality of phase wrapped images based on the plurality of echo signals, each phase wrapped image comprising one or more first wrapped values;
    generating a phase difference map based on the plurality of phase wrapped images, the phase difference map comprising one or ore second wrapped values;
    generating an unwrapped phase difference map by unwrapping the one or more second wrapped values in the phase difference map;
    determining a first field distribution map based on the unwrapped phase difference map; and
    generating a plurality of unwrapped phase images by unwrapping the one or more first wrapped values in each phase wrapped image based on the first field distribution map, wherein the generating of the plurality of unwrapped phase images includes:
        selecting one of he plurality of phase wrapped images as a reference phase map;
        determining a relative phase shift of each phase wrapped image based on the reference phase map and the first field distribution map;
        generating a partially unwrapped phase map of each phase wrapped image based on the relative phase shift of each phase wrapped image and the reference phase map;
        generating a baseline phase map based on the reference phase map and the partially unwrapped phase map of each phase wrapped image; and
        generating the plurality of unwrapped phase images based on the baseline phase map, the reference phase map and the partially unwrapped phase map of each phase wrapped image.

2. The method of claim 1, wherein the phase difference map comprises a plurality of phase difference values corresponding to at least two of the plurality of echo signals.

3. The method of claim 1, the method further comprising:
    generating a second field distribution map based on the reference phase map and the partially unwrapped phase map of each phase wrapped image.

4. The method of claim 1, wherein the generating of the unwrapped phase difference map comprises:
    generating an intermediate phase difference map based on the phase difference map;
    generating a local quality map based on the intermediate phase difference map, the local quality map including a plurality of quality values, and each pixel in the intermediate phase difference map corresponding to one of the plurality of quality values;
    generating an unwrapped intermediate phase difference map by performing phase unwrapping on the intermediate phase difference map based on the local quality map; and
    generating an unwrapped phase difference map by performing the phase unwrapping on the phase difference map based on the unwrapped intermediate phase difference map.

5. The method of claim 4, wherein the generating of the intermediate phase difference map comprises:
    performing a filtering process to the phase difference map.

6. The method of claim 4, wherein the generating of the unwrapped intermediate phase difference map by performing the phase unwrapping on the intermediate phase difference map based on the local quality map comprises:
    determining one or more pixels in the intermediate phase difference map as one or more starting seed points based on the local quality map, the one or more pixels corresponding to an optimal quality value; and
    marking the one or more starting seed points as one or more unwrapped points.

7. The method of claim 6, wherein the generating of the unwrapped intermediate phase difference map by performing the phase unwrapping on the intermediate phase difference map based on the local quality map further comprises:
    performing phase unwrapping on at least one neighbor pixel of each of the one or more starting seed points, a phase difference between at least one unwrapped neighbor pixel of each of the one or more starting seed points and each of the one or more starting seed points being less than $\pi$.

8. The method of claim 7, wherein the generating of the unwrapped intermediate phase difference map by performing the phase unwrapping on the intermediate phase difference map based on the local quality map further comprises:
    determining the at least one unwrapped neighbor pixel of each of the starting seed points as one or more new seed points.

9. The method of claim 8, wherein the generating of the unwrapped intermediate phase difference map by performing the phase unwrapping on the intermediate phase difference map based on the local quality map further comprises:
    determining whether the number of the seed points is less than a first threshold;
    performing the phase unwrapping on at least one neighbor pixel of all of the one or more new seed points in response to a determination that the number of the seed points is less than the first threshold.

10. The method of claim 8, wherein the generating of the unwrapped intermediate phase difference map by performing the phase unwrapping on the intermediate phase difference map based on the local quality map further comprises:
    determining whether the number of the seed points is greater than a first threshold; and
    performing the phase unwrapping on at least one neighbor pixel of a part of the one or more new seed points based on the corresponding local quality values, in response to a determination that the number of the one or more seed points is greater than the first threshold.

11. The method of claim 4, wherein the generating of the unwrapped phase difference map by performing the phase unwrapping on the phase difference map based on the unwrapped intermediate phase difference map comprises:
    performing the phase unwrapping on at least one pixel of the phase difference map comprising the one or more second wrapped values, a phase difference between the at least one pixel of the phase difference map and at least one pixel of the unwrapped intermediate phase difference map being less than $\pi$.

12. A system for phase unwrapping for use in magnetic resonance imaging, the system comprising:

one or more storage media comprising a set of instructions; and one or more processors configured to communicate with the one or more storage media, wherein when executing the set of instructions, the one or more processors are configured to cause the system to:

generate a plurality of phase wrapped images based on a plurality of echo signals, each phase wrapped image comprising one or more first wrapped values, and each phase wrapped image corresponding to one of the plurality of echo signals;

generate a phase difference map based on the plurality of phase wrapped images, the phase difference map comprising one or more second wrapped values;

generate an unwrapped phase difference map by unwrapping the one or more second wrapped values in the phase difference map;

determine a first field distribution map based on the unwrapped phase difference map; and generate a plurality of unwrapped phase images by unwrapping the one or more first wrapped values in each phase wrapped image based on the first field distribution map, wherein to generate the plurality of unwrapped phase images, the one or more processors are further configured to cause the system to:

select one of the plurality of phase wrapped images as a reference phase map;

determine a relative phase shift of each phase wrapped image based on the reference phase map and the first field distribution map;

generate a partially unwrapped phase map of each phase wrapped image based on the relative phase shift of each phase wrapped image and the reference phase map;

generate a baseline phase map based on the reference phase map and the partially unwrapped phase map of each phase wrapped image; and generate the plurality of unwrapped phase images based on the baseline phase map and the partially unwrapped phase map of each phase wrapped image.

13. The system of claim 12, the one or more processors are further configured to cause the system to:

generate a second field distribution map based on the baseline phase map, the reference phase map and the partially unwrapped phase map of each phase wrapped image.

14. The system of claim 12, wherein to generate the unwrapped phase difference map, the one or more processors are configured to cause the system to:

generate an intermediate phase difference map based on the phase difference map;

generate a local quality map based on the intermediate phase difference map, the local quality map including a plurality of quality values, and each pixel in the intermediate phase difference map corresponding to one of the plurality of quality values;

generate an unwrapped intermediate phase difference map by performing phase unwrapping on the intermediate phase difference map based on the local quality map; and generate an unwrapped phase difference map by performing the phase unwrapping on the phase difference map based on the intermediate phase difference map.

15. The system of claim 14, wherein to generate the unwrapped intermediate phase difference map by performing the phase unwrapping on the intermediate phase difference map based on the local quality map, the one or more processors are configured to cause the system to:

determine one or more pixels in the intermediate phase difference map as one or more starting seed points based on the local quality map, the one or more pixels corresponding to an optimal quality value;

mark the one or more starting seed points as one or more unwrapped points; and perform the phase unwrapping on at least one neighbor pixel of each of the one or more starting seed points.

16. The system of claim 15, wherein to generate the unwrapped intermediate phase difference map by performing the phase unwrapping on the intermediate phase difference map based on the local quality map, the one or more processors are further configured to cause the system to:

determine the at least one unwrapped neighbor pixel of each of he one or more starting seed points as one or more new seed points.

17. A non-transitory computer readable medium, comprising at least one set of instructions, wherein when executed by one or more processors of an electronic terminal, the at least one set of instructions directs the one or more processors to perform acts of:

obtaining a plurality of echo signals;

generating plurality of original phase maps based on the echo signals;

generating a phase difference map based on the original phase maps;

generating an unwrapped phase difference map by performing phase unwrapping on the phase difference map; and generating an unwrapped phase map corresponding to the original phase maps based on the original phase maps and the unwrapped phase difference map, wherein the generating of an unwrapped phase map corresponding to the original phase maps further includes:

selecting one of he plurality of original phase maps as a reference phase map;

determining a relative phase shift of each original phase map based on the reference phase map and a first field distribution map;

generate a partially unwrapped phase map of each original phase map based on the relative phase shift of each original phase map and the reference phase map;

generate a baseline phase map based on the reference phase map and the partially unwrapped phase map of each original phase map; and generate a plurality of unwrapped phase maps based on the baseline phase map and the partially unwrapped phase map of each phase wrapped image.

18. The non-transitory computer readable medium of claim 17, wherein the generating of the unwrapped phase difference map comprises:

generating a local quality map based on the phase difference map; and performing the phase unwrapping on the phase difference map based on the local quality map.

* * * * *

UNITED STATES PATENT AND TRADEMARK OFFICE
CERTIFICATE OF CORRECTION

PATENT NO. : 10,571,543 B2
APPLICATION NO. : 15/666674
DATED : February 25, 2020
INVENTOR(S) : Yongquan Ye et al.

Page 1 of 1

It is certified that error appears in the above-identified patent and that said Letters Patent is hereby corrected as shown below:

On the Title Page

In the Abstract
Item (57), Lines 1-2, "The present disclosure relates to systems and methods for vehicle management." should be removed.

Signed and Sealed this
Twenty-first Day of May, 2024

Katherine Kelly Vidal
*Director of the United States Patent and Trademark Office*